(12) United States Patent
Takahashi et al.

(10) Patent No.: US 8,922,281 B2
(45) Date of Patent: Dec. 30, 2014

(54) POWER AMPLIFIER AND OPERATION METHOD THEREFOR

(71) Applicant: Murata Manufacturing Co., Ltd., Nagaokakyo-shi, Kyoto-fu (JP)

(72) Inventors: Wataru Takahashi, Nagaokakyo (JP); Toshiki Matsui, Nagaokakyo (JP); Jun Sakatsume, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/029,042

(22) Filed: Sep. 17, 2013

(65) Prior Publication Data

US 2014/0167856 A1 Jun. 19, 2014

Related U.S. Application Data

(63) Continuation of application No. PCT/JP2012/073042, filed on Sep. 10, 2012.

(30) Foreign Application Priority Data

Sep. 15, 2011 (JP) ................. 2011-201680

(51) Int. Cl.
  *H03F 1/56* (2006.01)
  *H03F 1/02* (2006.01)
  *H03F 3/195* (2006.01)
  *H03F 3/21* (2006.01)
  *H03F 3/24* (2006.01)
  *H03F 3/72* (2006.01)

(52) U.S. Cl.
  CPC ................ *H03F 1/56* (2013.01); *H03F 1/0277* (2013.01); *H03F 1/565* (2013.01); *H03F 3/195* (2013.01); *H03F 3/211* (2013.01); *H03F 3/245* (2013.01); *H03F 3/72* (2013.01); *H03F 2200/108* (2013.01); *H03F 2200/111* (2013.01); *H03F 2200/387* (2013.01); *H03F 2200/429* (2013.01); *H03F 2200/507* (2013.01); *H03F 2203/7215* (2013.01); *H03F 2203/7227* (2013.01); *H03F 2203/7236* (2013.01)
  USPC ....................................... 330/295; 330/124 R

(58) Field of Classification Search
  USPC .......................... 330/295, 124 R, 53, 84, 286
  See application file for complete search history.

(56) References Cited

U.S. PATENT DOCUMENTS 7,157,966 B2  1/2007  Baree et al.
8,018,285 B2 *  9/2011  Kim et al. ..................... 330/284

(Continued)

FOREIGN PATENT DOCUMENTS

JP     10-308639 A     11/1998
JP     2002-100935 A   4/2002

(Continued)

OTHER PUBLICATIONS

Official Communication issued in International Patent Application No. PCT/JP2012/073042, mailed on Dec. 11, 2012.

(Continued)

*Primary Examiner* — Hieu Nguyen
(74) *Attorney, Agent, or Firm* — Keating & Bennett, LLP

(57) ABSTRACT

In a power amplifier, in response to a power mode signal at a predetermined level, a first switch circuit supplies a signal to first and second amplifier devices that perform parallel operations. In response to the power mode signal at another level, the first switch circuit supplies a signal to the first amplifier device and stops supplying the signal to the second amplifier device such that the first amplifier device performs a standalone operation. One end of an impedance adjusting circuit is connected to a connection node between the outputs of the first and second amplifier devices, the other end of the impedance adjusting circuit is connected to one end of a second switch circuit, and the other end of the second switch circuit is connected to a ground potential. The impedance adjusting circuit includes a reactance element.

20 Claims, 10 Drawing Sheets

(56) References Cited

U.S. PATENT DOCUMENTS

| | | |
|---|---|---|
| 8,102,213 B2 * | 1/2012 | Tasic et al. .................. 330/283 |
| 8,324,964 B2 * | 12/2012 | Retz et al. .................. 330/51 |
| 8,598,951 B1 * | 12/2013 | Hau .................. 330/124 R |
| 2005/0236689 A1 | 10/2005 | Sugiura et al. |
| 2007/0298736 A1 | 12/2007 | Fujioka et al. |
| 2010/0060354 A1 | 3/2010 | Maeda |

FOREIGN PATENT DOCUMENTS

| | | |
|---|---|---|
| JP | 2004-134823 A | 4/2004 |
| JP | 2005-311852 A | 11/2005 |
| JP | 2008-35487 A | 2/2008 |

OTHER PUBLICATIONS

Deng et al., "A SiGe PA with Dual Dynamic Bias Control and Memoryless Digital Predistortion for WCDMA Handset Applications", 2005 IEEE Radio Frequency Integrated Circuits Symposium, vol. 41, Jun. 12-14, 2005, pp. 247-250.

Deng et al., "A SiGe PA with Dual Dynamic Bias Control and Memoryless Digital Predistortion for WCDMA Handset Applications", 2006 IEEE Journal of Solid-State Circuits, vol. 41, No. 5, May 2006, pp. 1210-1221.

Deng et al., "A High Average-Efficiency SiGe HBT Power Amplifier for WCDMA Handset Applications", IEEE Transactions on Microwave Theory and Techniques, vol. 53, No. 2, Feb. 2005, pp. 529-537.

* cited by examiner

POWER AMPLIFIER AND OPERATION METHOD THEREFOR

BACKGROUND OF THE INVENTION

1. Field of the Invention

The present invention relates to power amplifiers and the operation methods therefor. Specifically, the present invention relates to techniques that are effective to optimize an output impedance of a power amplifier when a stand-alone amplification operation of a first amplifier device and parallel amplification operations of the first amplifier device and a second amplifier device are performed.

2. Description of the Related Art

In portable communication apparatus terminals that are battery operated, such as cellular phones, it is required to increase the power efficiency of a power amplifier that transmits RF transmission signals to a base station. The power consumption of a power amplifier needs to be reduced to increase the amount of talk time per battery charge as much as possible.

In U.S. Pat. No. 7,157,966 below, it is disclosed that by connecting, in parallel, a first output stage in which the device size of an output transistor has been optimized for high power and a second output stage in which the device size of an output transistor is optimized for low power, a bias control circuit selects the first output stage during high power operation and the second output stage during low power operation. The first output stage and the second output stage are connected to a single output impedance matching circuit, and the single output impedance matching circuit includes a plurality of capacitors and a plurality of inductors.

Junxiong Deng et al, "A High Average-Efficiency SiGe HBT Power Amplifier for WCDMA Handset Application" IEEE TRANSACTIONS ON MICRO WAVE THEORY AND TECHUNIQUES, VOL. 53, NO. 2, FEBRUARY 2005, PP. 529-537, describes a power amplifier of a cellular phone in which the number of silicon germanium (SiGe) based hetero junction bipolar transistors (HBTs) in an on state is adjusted in response to a change in desired output power. As a result of a low-loss MOS switch being used for the base of each of the transistors, the SiGe HBT transistors are dynamically biased, whereby each of the transistors is completely turned on or completely turned off.

Junxiong Deng et al, "A SiGe PA with Dual Dynamic Bias Control and Memoryless Digital Predistortion for WCDMA Handset Application" 2005 IEEE Radio Frequency Integrated Circuits Symposium, VOL. 41, 12-14 Jun. 2005, PP. 247-250, and Junxiong Deng et al, "A SiGe PA with Dual Dynamic Bias Control and Memoryless Digital Predistortion for WCDMA Handset Application" 2006 IEEE JOURNAL OF SOLID-STATE CIRCUITS, VOL. 41, NO. 5, MAY 2006, PP. 1210-1221, describe a power amplifier of a cellular phone where, by forming SiGe HBT transistors in two groups which are a high-output group and a low-output group, the transistor is biased with a power supply voltage Vcc in the high-output group, and two transistors are connected in series and biased with half the power supply voltage, Vcc/2, in the low-output group. Switching between the different groups is controlled by a low-loss MOS switch of the base of the HBT transistor. When the power amplifier is in a low-output region, the high-output group is switched off and the low-output group is switched on. Since the bias voltage has been decreased in the low-output group, DC power loss is markedly reduced. The base of the HBT transistor in the high-output group and the base of the HBT transistor in the low-output group are driven by the output signal of a drive stage through an inter-stage matching circuit and a low-loss MOS switch. It is stated in Junxiong Deng et al, "A SiGe PA with Dual Dynamic Bias Control and Memoryless Digital Predistortion for WCDMA Handset Application" 2006 IEEE JOURNAL OF SOLID-STATE CIRCUITS, VOL. 41, NO. 5, MAY 2006, PP. 1210-1221, that the collector of the HBT transistor in the high-output group is directly connected to the input terminal of an output matching circuit, the collectors of the two transistors in the low-output group are connected to one end of an inductor through two capacitors, the other end of the inductor is connected to the input terminal of the output matching circuit, and the output matching circuit is formed of a plurality of capacitors and a plurality of inductors.

FIG. 12 of Japanese Unexamined Patent Application Publication No. 2008-35487 below illustrates an RF power amplifier in which an input signal is directly supplied to the gate of a first amplifier device, the input signal is supplied to the gate of a second amplifier device through a micro-electro-mechanical systems (MEMS) switch, the source of the first amplifier device and the source of the second amplifier device are commonly connected to a ground potential, and the drain of the first amplifier device and the drain of the second amplifier device are commonly connected to a power supply voltage through a load inductor.

Prior to the present invention, the inventors and others participated in the development of a power amplifier that can be mounted in a communication terminal of a next generation cellular phone and that can increase the amount of talk time per battery charge as much as possible.

In order to realize long talk time, it is necessary to optimize the device size or number of output transistors of a power amplifier in a cellular phone in accordance with the output power level. In other words, the device size or number of output transistors is set to a small value when the output level is low, while the device size or number of output transistors is set to a large value when the output level is high, thereby improving the power added efficiency (PAE) of the power amplifier and realizing long talk time.

Although the methods described in U.S. Pat. No. 7,157,966, Junxiong Deng et al, "A High Average-Efficiency SiGe HBT Power Amplifier for WCDMA Handset Application" IEEE TRANSACTIONS ON MICRO WAVE THEORY AND TECHUNIQUES, VOL. 53, NO. 2, FEBRUARY 2005, PP. 529-537, Junxiong Deng et al, "A SiGe PA with Dual Dynamic Bias Control and Memoryless Digital Predistortion for WCDMA Handset Application" 2005 IEEE Radio Frequency Integrated Circuits Symposium, VOL. 41, 12-14 Jun. 2005, PP. 247-250, and Junxiong Deng et al, "A SiGe PA with Dual Dynamic Bias Control and Memoryless Digital Predistortion for WCDMA Handset Application" 2006 IEEE JOURNAL OF SOLID-STATE CIRCUITS, VOL. 41, NO. 5, MAY 2006, PP. 1210-1221, allow the optimization described above to be realized, a study by the inventors and others prior to the present invention clarified that these methods have a problem in that, since output transistors having a large device size or provided in a large number and output transistors having a small size or provided in a small number are used, an area occupied by a semiconductor chip is large and the price of a product is high.

The method disclosed in FIG. 12 of Japanese Unexamined Patent Application Publication No. 2008-35487 is a method which also realizes the optimization described above, and the stand-alone amplification operation of the first amplifier device realizes the function of output transistors having a small size or provided in a small number, while the parallel amplification operations of the first amplifier device and the second amplifier device realize the function of output transistors having a large device size or provided in a large number. Hence, this method has an advantage in that an area occupied by a semiconductor chip is small and the price of a product is low.

On the other hand, in the method described in FIG. 12 of Japanese Unexamined Patent Application Publication No. 2008-35487, the output impedance of the power amplifier during a stand-alone operation of the first amplifier device is relatively large, for example, 2 Ω to 3 Ω, while the output impedance of the power amplifier during the parallel amplification operations of the first amplifier device and the second amplifier device is relatively small, for example, 1Ω to 2 Ω. Further, the load pull measurements performed in the study by the inventors and others prior to the present invention clarified that with this method, the above-described stand-alone amplification operation and the above-described parallel amplification operations are different not only in terms of the output impedance but also in terms of the plot diagram of the maximum output and the plot diagram of the minimum power consumption on the Smith chart. In the load pull measurements, which are well known in the area of RF power amplifiers, a measurement parameter, such as output power, is plotted as a complex function of a load as seen from an output transistor.

It is necessary to set the output impedance of a power amplifier in such a manner that importance is placed more on the maximum output power than on the minimum current consumption during the parallel amplification operations of the first amplifier device and the second amplifier device described above, whereas it is necessary to set the output impedance of the power amplifier in such a manner that importance is placed more on the minimum current consumption than on the maximum output power during the stand-alone amplification operation of the first amplifier device described above.

However, Japanese Unexamined Patent Application Publication No. 2008-35487 does not disclose a method of optimizing the output impedance of a power amplifier in such a manner that importance is placed on the minimum current consumption and the maximum output power respectively during the stand-alone amplification operation and the parallel amplification operations described above.

On the other hand, the study by the inventors and others prior to the present invention clarified that the methods described in Junxiong Deng et al, "A High Average-Efficiency SiGe HBT Power Amplifier for WCDMA Handset Application" IEEE TRANSACTIONS ON MICRO WAVE THEORY AND TECHUNIQUES, VOL. 53, NO. 2, FEBRUARY 2005, PP. 529-537, Junxiong Deng et al, "A SiGe PA with Dual Dynamic Bias Control and Memoryless Digital Predistortion for WCDMA Handset Application" 2005 IEEE Radio Frequency Integrated Circuits Symposium, VOL. 41, 12-14 Jun. 2005, PP. 247-250, and Junxiong Deng et al, "A SiGe PA with Dual Dynamic Bias Control and Memoryless Digital Predistortion for WCDMA Handset Application" 2006 IEEE JOURNAL OF SOLID-STATE CIRCUITS, VOL. 41, NO. 5, MAY 2006, PP. 1210-1221, have a problem in that many of the low-loss MOS switches, for example, four of them, are connected to the bases of the HBT transistors in the high-output group and the low-output group.

Two of the four MOS switches supply an input signal to the bases of the HBT transistors, while the remaining two MOS switches have a function of discharging the base charges of the HBT transistors to the ground. However, an RF signal, having a relatively large voltage amplitude, of a power amplifier is supplied to these four transistors. The reason for this is that since the power amplification circuit including the HBT transistors of the high-output group and the low-output group forms the final amplification stage of an amplifier, the input terminal of the final amplification stage is driven by an RF signal amplified by the first amplification stage or an intermediate amplification stage. Hence, there is a problem in that since these four MOS transistors need to have a relatively high break down voltage, semiconductor chip areas occupied by these four MOS transistors are large and the price of a product is high. The above described problem was clarified by the study performed by the inventors and others prior to the present invention.

SUMMARY OF THE INVENTION

Preferred embodiments of the present invention were developed based on the above-described results of the study performed by the inventors and others prior to the present invention.

Preferred embodiments of the present invention optimize an output impedance of a power amplifier at a time when a stand-alone amplification operation of a first amplifier device and parallel amplification operations of the first amplifier device and a second amplifier device are performed.

Preferred embodiments of the present invention significantly reduce an area occupied by a semiconductor chip of a switch circuit that switches between the stand-alone amplification operation of the first amplifier device and the parallel amplification operations of the first amplifier device and the second amplifier device.

A power amplifier according to a representative preferred embodiment of the present invention includes an RF signal input terminal; a first amplifier device; a second amplifier device; a load device; a first switch circuit; a second switch circuit; and an impedance adjusting circuit.

A common electrode of the first amplifier device and a common electrode of the second amplifier device are connected to a ground potential, and an output electrode of the first amplifier device and an output electrode of the second amplifier device are connected to the load device.

The first switch circuit, in response to a power mode signal at a first voltage level supplies an RF input signal of the RF signal input terminal to an input electrode of the first amplifier device and to an input electrode of the second amplifier device, such that the first amplifier device and the second amplifier device perform parallel amplification operations on the RF input signal.

The first switch circuit, in response to the power mode signal at a second voltage level different from the first voltage level, supplies the RF input signal of the RF signal input terminal to the input electrode of the first amplifier device and substantially stops supplying of the RF signal to the input electrode of the second amplifier device, such that the first amplifier device performs a stand-alone amplification operation on the RF input signal.

One end of the impedance adjusting circuit is connected to a connection node between the output electrode of the first amplifier device and the output electrode of the second amplifier device, the other end of the impedance adjusting circuit is connected to one end of the second switch circuit, and the other end of the second switch circuit is connected to the ground potential.

The impedance adjusting circuit includes a reactance element connected between the one end and the other end of the impedance adjusting circuit.

The second switch circuit causes the one end and the other end of the second switch circuit to be electrically disconnected from each other in response to the power mode signal at the second voltage level, and causes the one end and the other end of the second switch circuit to be electrically connected to each other in response to the power mode signal at the first voltage level.

That is, according to various preferred embodiments of the present invention, an output impedance of a power amplifier is optimized when a stand-alone amplification operation of a first amplifier device and parallel operations of the first amplifier device and a second amplifier device are performed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First, overviews of representative preferred embodiments of the present invention disclosed in the present application will be described. Reference symbols, in parentheses, in the figures referred to in the overview descriptions regarding the representative preferred embodiments indicate only example components covered by the concepts of the constituent components to which the reference symbols are attached.

A power amplifier according to a representative preferred embodiment of the present invention includes an RF signal input terminal (RF input); a first amplifier device (Q1); a second amplifier device (Q2); a load device (L1); a first switch circuit (SW1); a second switch circuit (SW2); and an impedance adjusting circuit (Zadj).

A common electrode of the first amplifier device (Q1) and a common electrode of the second amplifier device (Q2) are connected to a ground potential (GND), and an output electrode of the first amplifier device (Q1) and an output electrode of the second amplifier device (Q2) are connected to the load device (L1).

The first switch circuit (SW1), in response to a power mode signal (PM) at a first voltage level (high level "1"), supplies an RF input signal of the RF signal input terminal to an input electrode of the first amplifier device (Q1) and to an input electrode of the second amplifier device (Q2), such that the first amplifier device (Q1) and the second amplifier device (Q2) perform parallel amplification operations on the RF input signal.

The first switch circuit (SW1), in response to the power mode signal (PM) at a second voltage level (low level "0") different from the first voltage level, supplies the RF input signal of the RF signal input terminal to the input electrode of the first amplifier device (Q1) and substantially stops supplying of the RF signal to the input electrode of the second amplifier device (Q2), such that the first amplifier device (Q1) performs a stand-alone amplification operation on the RF input signal.

One end of the impedance adjusting circuit (Zadj) is connected to a connection node between the output electrode of the first amplifier device (Q1) and the output electrode of the second amplifier device (Q2), the other end of the impedance adjusting circuit (Zadj) is connected to one end of the second switch circuit (SW2), and the other end of the second switch circuit (SW2) is connected to the ground potential (GND).

The impedance adjusting circuit (Zadj) includes a reactance element (C2) connected between the one end and the other end of the impedance adjusting circuit (Zadj).

Figure 1:
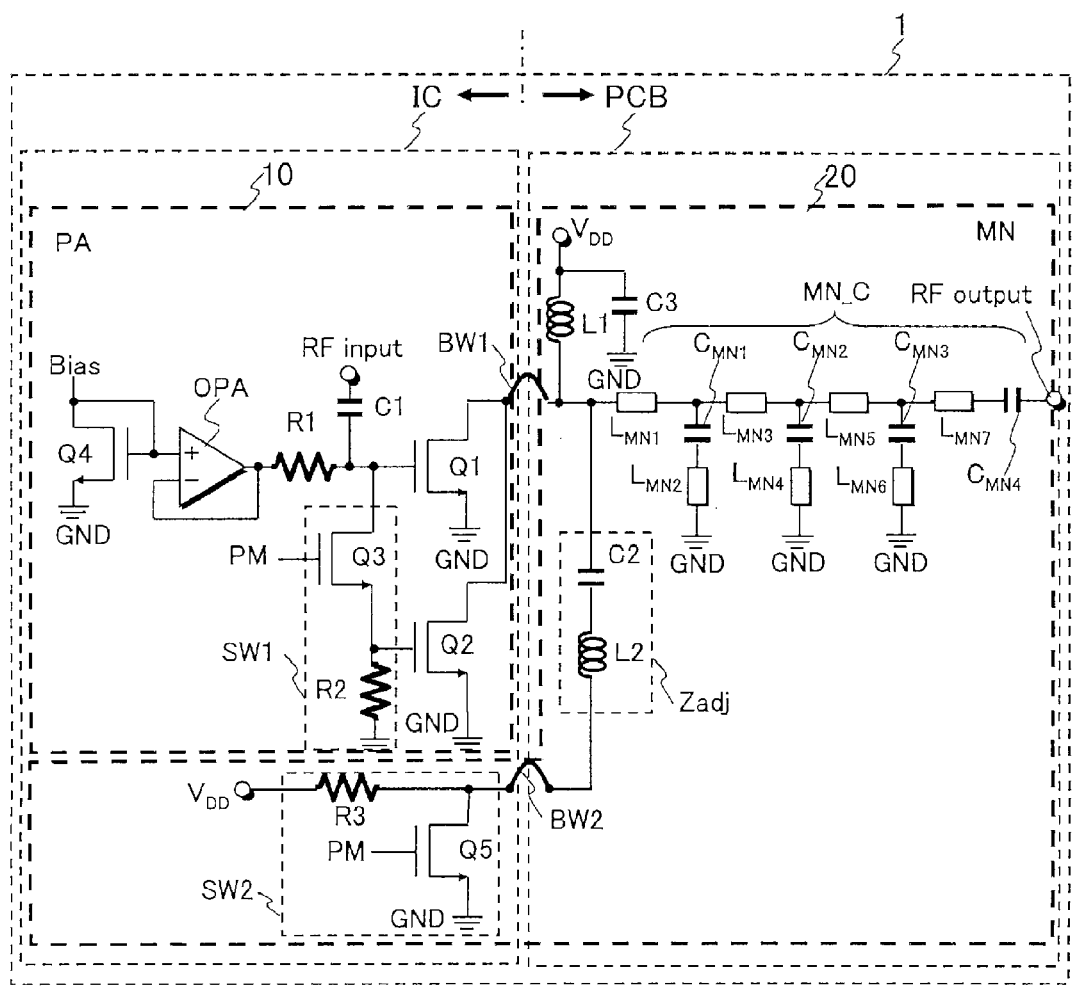
FIG. 1 is a diagram illustrating the configuration of a power amplifier 1 according to a first preferred embodiment of the present invention.

The second switch circuit (SW2) causes the one end and the other end of the second switch circuit (SW2) to be electrically disconnected from each other in response to the power mode signal (PM) at the second voltage level (low level "0"), and causes the one end and the other end of the second switch circuit (SW2) to be electrically connected to each other in response to the power mode signal (PM) at the first voltage level (high level "1") (refer to FIG. 1).

According to above-described preferred embodiment, the output impedance of a power amplifier can be optimized when a stand-alone amplification operation of a first amplifier device and parallel operations of the first amplifier device and a second amplifier device are performed.

In a preferable preferred embodiment, the reactance element connected between the one end and the other end of the impedance adjusting circuit is a capacitive reactance element (C2) (refer to FIG. 1), for example.

In another preferable preferred embodiment, the reactance element connected between the one end and the other end of the impedance adjusting circuit (Zadj) includes an inductive reactance element (L2) connected in series with the capacitive reactance element (C2) (refer to FIG. 1).

The power amplifier (1) according to still another preferable preferred embodiment further includes an output matching circuit (MN_C) whose input terminal is connected to the output electrode of the first amplifier device (Q1) and the output electrode of the second amplifier device (Q2), and an antenna is connectable to an output terminal (RF output) of the output matching circuit (MN_C) (refer to FIG. 1).

In a more preferable preferred embodiment, the first switch circuit (SW1) includes a first switch device (Q3) connected between the input electrode of the first amplifier device (Q1) and the input electrode of the second amplifier device (Q2).

The first switch device (Q3) of the first switch circuit (SW1) is switched on in response to the power mode signal (PM) at the first voltage level while the first switch device (Q3) of the first switch circuit (SW1) is switched off in response to the power mode signal (PM) at the second voltage level (refer to FIG. 1).

In another more preferable preferred embodiment, the first switch circuit (SW1) further includes a discharging element (R2) connected between the input electrode of the second amplifier device (Q2) and the ground potential (GND) (refer to FIG. 1).

In still another more preferable preferred embodiment, the second switch circuit (SW2) includes a second switch device (Q5) connected between the one end and the other end of the second switch circuit (SW2), and the second switch device (Q5) is switched on in response to the power mode signal (PM) at the first voltage level while the second switch device (Q5) is switched off in response to the power mode signal (PM) at the second voltage level (refer to FIG. 1).

In a different more preferable preferred embodiment, the one end of the impedance adjusting circuit (Zadj) is connected to the input terminal of the output matching circuit (MN_C) (refer to FIG. 1).

Figure 7:
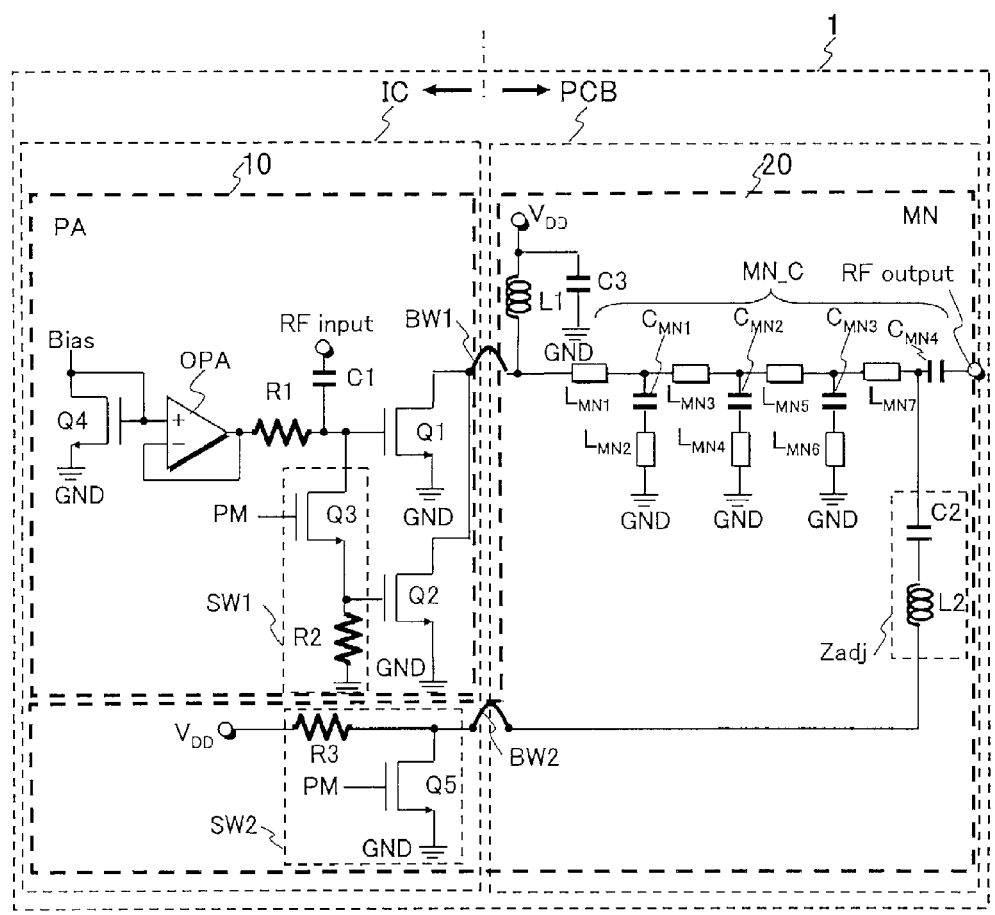
FIG. 7 is a diagram illustrating another configuration of a power amplifier 1 according to a second preferred embodiment of the present invention.

In a still different more preferable preferred embodiment, the one end of the impedance adjusting circuit (Zadj) is connected to the output terminal of the output matching circuit (MN_C) (refer to FIG. 7).

In a specific preferred embodiment, the output matching circuit (MN_C) includes an intermediate node between the input terminal and the output terminal (RF output) of the output matching circuit (MN_C).

The one end of the impedance adjusting circuit (Zadj) is connected to a connection node between the input terminal and the intermediate node of the output matching circuit (MN_C).

In another specific preferred embodiment, the output matching circuit (MN_C) includes an intermediate node between the input terminal and the output terminal (RF output) of the output matching circuit (MN_C).

The one end of the impedance matching circuit (Zadj) is connected to another connection node between the intermediate node and the output terminal (RF output) of the output matching circuit (MN_C).

The power amplifier (1) according to a more specific preferred embodiment preferably further includes another amplifier device (Q4) as a bias device connected to the input electrode of the first amplifier device (Q1) and the input electrode of the second amplifier device (Q2).

A common electrode of the other amplifier device (Q4) is connected to the ground potential (GND) and an input electrode and an output electrode of the other amplifier device (Q4) are connected to the input electrode of the first amplifier device (Q1) and the input electrode of the second amplifier device (Q2) (refer to FIG. 1).

In a most specific preferred embodiment the first amplifier device (Q1), the second amplifier device (Q2), and the other amplifier device (Q4) preferably are MOS transistors or bipolar transistors, for example.

A representative preferred embodiment of the present invention from another viewpoint is an operation method for a power amplifier that includes an RF signal input terminal (RF input), a first amplifier device (Q1), a second amplifier device (Q2), a load device (L1), a first switch circuit (SW1), a second switch circuit (SW2), and an impedance adjusting circuit (Zadj).

A common electrode of the first amplifier device (Q1) and a common electrode of the second amplifier device (Q2) are connected to a ground potential (GND), and an output electrode of the first amplifier device (Q1) and an output electrode of the second amplifier device (Q2) are connected to the load device (L1).

The operation method includes supplying an RF input signal of the RF signal input terminal to an input electrode of the first amplifier device (Q1) and to an input electrode of the second amplifier device (Q2) in response to a power mode signal (PM) at a first voltage level (high level "1"), using the first switch circuit (SW1), thus performing parallel amplification operations on the RF input signal, using the first amplifier device (Q1) and the second amplifier device (Q2).

The operation method further includes supplying the RF input signal of the RF signal input terminal to the input electrode of the first amplifier device (Q1) and substantially stopping supplying of the RF signal to the input electrode of the second amplifier device (Q2) in response to the power mode signal (PM) at a second voltage level (low level "0") different from the first voltage level, using the first switch circuit (SW1), thus performing a stand-alone amplification operation for the RF input signal, using the first amplifier device (Q1).

One end of the impedance adjusting circuit (Zadj) is connected to a connection node between the output electrode of the first amplifier device (Q1) and the output electrode of the second amplifier device (Q2), the other end of the impedance adjusting circuit (Zadj) is connected to one end of the second switch circuit (SW2), and the other end of the second switch circuit (SW2) is connected to the ground potential (GND).

The impedance adjusting circuit (Zadj) includes a reactance element (C2) connected between the one end and the other end of the impedance adjusting circuit (Zadj).

The operation method further includes causing the one end and the other end of the second switch circuit (SW2) to be electrically disconnected from each other in response to the power mode signal (PM) at the second voltage level (low level "0") and causing the one end and the other end of the second switch circuit (SW2) to be electrically connected to each other in response to the power mode signal at the first voltage level (high level "1"), using the second switch circuit (SW2) (refer to FIG. 1).

According to the above-described preferred embodiment, the output impedance of a power amplifier can be optimized when a stand-alone amplification operation of a first amplifier device and parallel operations of the first amplifier device and a second amplifier device are performed.

Next, preferred embodiments of the present invention will be described in detail. It should be noted that, in all the figures for describing preferred embodiments of the present invention, components having the same functions as those in the figures described above are denoted by the same reference symbols and duplicate descriptions thereof are omitted.

First Preferred Embodiment

FIG. 1 is a diagram illustrating the configuration of a power amplifier 1.

The power amplifier 1 illustrated in FIG. 1 is configured as a high-frequency module 1 that can be mounted in a cellular phone communication terminal which can be battery operated, for example. The high-frequency module 1 includes a semiconductor chip IC, which is a silicon semiconductor integrated circuit, and a multilayer wiring substrate PCB. Scaled down n-channel and p-channel MOS transistors and resistors are integrated in the semiconductor chip IC, which is a silicon semiconductor integrated circuit, through a CMOS semiconductor manufacturing process. The multilayer wiring substrate PCB includes surface-mount capacitors and inductors, inductors including strip lines, and inductors corresponding to parasitic inductances generated by interlayer connection wiring lines.

The semiconductor chip IC includes a power amplifier unit (PA) 10 provided therein, and the power amplifier unit (PA) 10 includes n-channel MOS transistors Q1, Q2, Q3, Q4, and Q5, an operational amplifier OPA, resistors R1 and R2, and a capacitor C1.

The transistor Q1 and the transistor Q2 respectively function as a first amplifier device and a second amplifier device, and the source of the transistor Q1 and the source of the transistor Q2 are connected to a ground potential GND. Specifically, the source of the transistor Q1 and the source of the transistor Q2 provided on a main surface of the semiconductor chip IC are connected to a back surface ground electrode located on the back surface of the semiconductor chip IC through via conductor layers disposed within the semiconductor chip IC. The back surface ground electrode of the semiconductor chip IC is connected to a ground wiring line of the mother board of a cellular phone communication terminal through via electrode layers disposed within the multilayer wiring substrate PCB. As a result, the transistors Q1 and Q2 perform electrically and thermally stable amplification operations as source-grounded amplifier devices.

A drain-source current path of the transistor Q3 of a first switch circuit SW1 is connected between the gates of the transistors Q1 and Q2, and a power mode signal PM is supplied to the gate of the transistor Q3. Since the transistor Q3 is turned on in response to the power mode signal PM of a high level "1", an RF input signal "RF input" is supplied to the gates of the transistors Q1 and Q2 through the capacitor C1. As a result, when the power mode signal PM is at a high level "1", the transistors Q1 and Q2 functioning as the first amplifier device and the second amplifier device perform parallel amplification operations on the RF input signal "RF input". On the other hand, when the power mode signal PM is at a low level "0", since the transistor Q3 enters an off state, the RF input signal "RF input" is supplied to only the gate of the transistor Q1, and the potential of the gate of the transistor Q2 is set to the ground potential GND through the resistor R2 of the first switch circuit SW1. As a result, when the power mode signal PM is at a low level "0", the transistor Q1 functioning as the first amplifier device performs a stand-alone amplification operation for the RF input signal "RF input". Here, the RF input signal "RF input" is generated by a transmission signal processing unit of an RF signal processing semiconductor integrated circuit (RFIC) mounted in a cellular phone terminal, and the power mode signal PM may be generated by either the RF signal processing semiconductor integrated circuit (RFIC) or a baseband processor mounted in the cellular phone terminal.

The gate and drain of the transistor Q4 are connected to each other and are connected to the non-inverted terminal of the operational amplifier OPA. The inverted terminal and the output terminal of the operational amplifier OPA are connected to each other and are connected to the gate of the transistor Q1 through the resistor R1. As a result of a bias current Bias being supplied to the drain-source current path of the transistor Q4, a bias voltage is generated between the gate and the source. The gate-source bias voltage of the transistor Q4 is made to be applicable to the gates of the transistor Q1 and the transistor Q2 through the operational amplifier OPA, which operates as a voltage follower. Hence, the transistor Q4 and the transistors Q1 and Q2 are connected to a current-mirror-type circuit through the operational amplifier OPA functioning as a voltage follower. As a result, the transistors Q1 and Q2 can perform stable amplification operations for variations in the manufacturing process of the semiconductor chip IC, variations in temperature, and variations in the power supply voltage. It should be noted that the resistor R1 connected between the gate of the transistor Q1 and the output terminal of the operational amplifier OPA has a function of attenuating the signal component of the RF input signal "RF input" which flows into the output terminal of the operational amplifier OPA.

The drain of the transistor Q1 and the drain of the transistor Q2 are connected to each other and are connected to one end of a bonding wire BW1.

The semiconductor chip IC includes a second switch circuit SW2 provided therein. The second switch circuit SW2 includes the transistor Q5 whose gate is supplied with the power mode signal PM and a resistor R3 one end of which is connected to the drain of the transistor Q5 and the other end of which is supplied with a power supply voltage VDD. The function and operation of the second switch circuit SW2 will be described later in detail.

An output matching unit (MN) 20 of the power amplifier is provided on the multilayer wiring substrate PCB, and the output matching unit (MN) 20 includes an inductor L1, a capacitor C3, an output matching circuit MN_C, and an impedance adjusting circuit Zadj.

One end of the inductor L1 is connected to the power supply voltage VDD, and the other end of the inductor L1 is connected the other end of the bonding wire BW1. Hence, the inductor L1 is not actually included in the output matching unit (MN) 20 and functions as a common drain load element of the transistor Q1 and the transistor Q2.

One end of the capacitor C3 is connected to the power supply voltage VDD and the one end of the inductor L1, and the other end of the capacitor C3 is connected to the ground potential GND. Hence, the capacitor C3 is not actually included in the output matching unit (MN) 20, and has a function of attenuating a power supply ripple component flowing into the drains of the transistor Q1 and the transistor Q2.

The output matching circuit MN_C preferably has a function of impedance matching between a low output impedance of about several Ω at the mutually connected drains of the transistors Q1 and Q2 of the power amplifier unit (PA) 10 and a relatively high impedance of about 50 Ω at the transmission antenna of a cellular phone communication terminal, for example. The transmission antenna of a cellular phone communication terminal is connected to an output signal terminal "RF output" of the output matching circuit MN_C through an antenna switch (not illustrated) or the like.

Hence, the output matching circuit MN_C includes a plurality of inductors LMN1, LMN3, LMN5, and LMN 7 and a capacitor CMN4 connected in series between the RF output signal terminal "RF output" and the mutually connected drains of the transistors Q1 and Q2. Further the output matching circuit MN_C includes a capacitor CMN1 and an inductor LMN2 connected in series between a first intermediate node and the ground potential GND, includes a capacitor LMN2 and an inductor LMN4 connected in series between a second intermediate node and the ground potential GND, and includes a capacitor LMN3 and an inductor LMN6 connected in series between a third intermediate node and the ground potential GND.

The impedance adjusting circuit Zadj was added to the power amplifier 1 in the preferred embodiment of the present invention as a key component. In other words, the impedance adjusting circuit Zadj was added to the power amplifier 1 while taking into consideration the fact that the output impedance of the power amplifier 1 during the stand-alone amplification operation of the transistor Q1 as the first amplifier device is relatively high, i.e., about 2 Ω to about 3 Ω, whereas the output impedance of the power amplifier 1 during the parallel amplification operations of the transistors Q1 and Q2 as the first amplifier device and the second amplifier device is relatively low, i.e., about 1 Ω to about 2 Ω. Further, the impedance adjusting circuit Zadj was added to the power amplifier 1 taking into consideration the fact that the stand-alone amplification operation and the parallel amplification operations are different not only in terms of the output impedance but also in terms of the plot diagram of the maximum output and the plot diagram of the minimum power consumption on the Smith chart.

The impedance adjusting circuit Zadj is connected between the drain of the transistor Q5 of the second switch circuit SW2 and the mutually connected drains of the transistors Q1 and Q2 of the power amplifier unit (PA) 10, as follows. The impedance adjusting circuit Zadj includes a capacitor C2 and an inductor L2. One end of the capacitor C2 is connected to the mutually connected drains of the transistors Q1 and Q2, the other end of the capacitor C2 is connected to one end of the inductor L2, and the other end of the inductor L2 is connected to the drain of the transistor Q5 of the second switch circuit SW2 through a bonding wire BW2.

Accordingly, the transistor Q5 of the second switch circuit SW2 provided in the semiconductor chip IC is controlled so as to be in an on state in response to the power mode signal PM at a high level "1", when the transistors Q1 and Q2 perform parallel amplification operations on the RF input signal "RF input" in response to the power mode signal PM at a high level "1". Hence, the impedance adjusting circuit Zadj is controlled so as to be in an active state as a result of the transistor Q5 of the second switch circuit SW2 being controlled so as to be in an on state.

On the other hand, the transistor Q5 of the second switch circuit SW2 provided in the semiconductor chip IC is controlled so as to be in an off state in response to the power mode signal PM at a low level "0", when the transistors Q1 performs a stand-alone amplification operation for the RF input signal "RF input" in response to the power mode signal PM at a low level "0". Hence, the impedance adjusting circuit Zadj is controlled so as to be in an inactive state as a result of the transistor Q5 of the second switch circuit SW2 being controlled so as to be in an off state.

Figure 2:
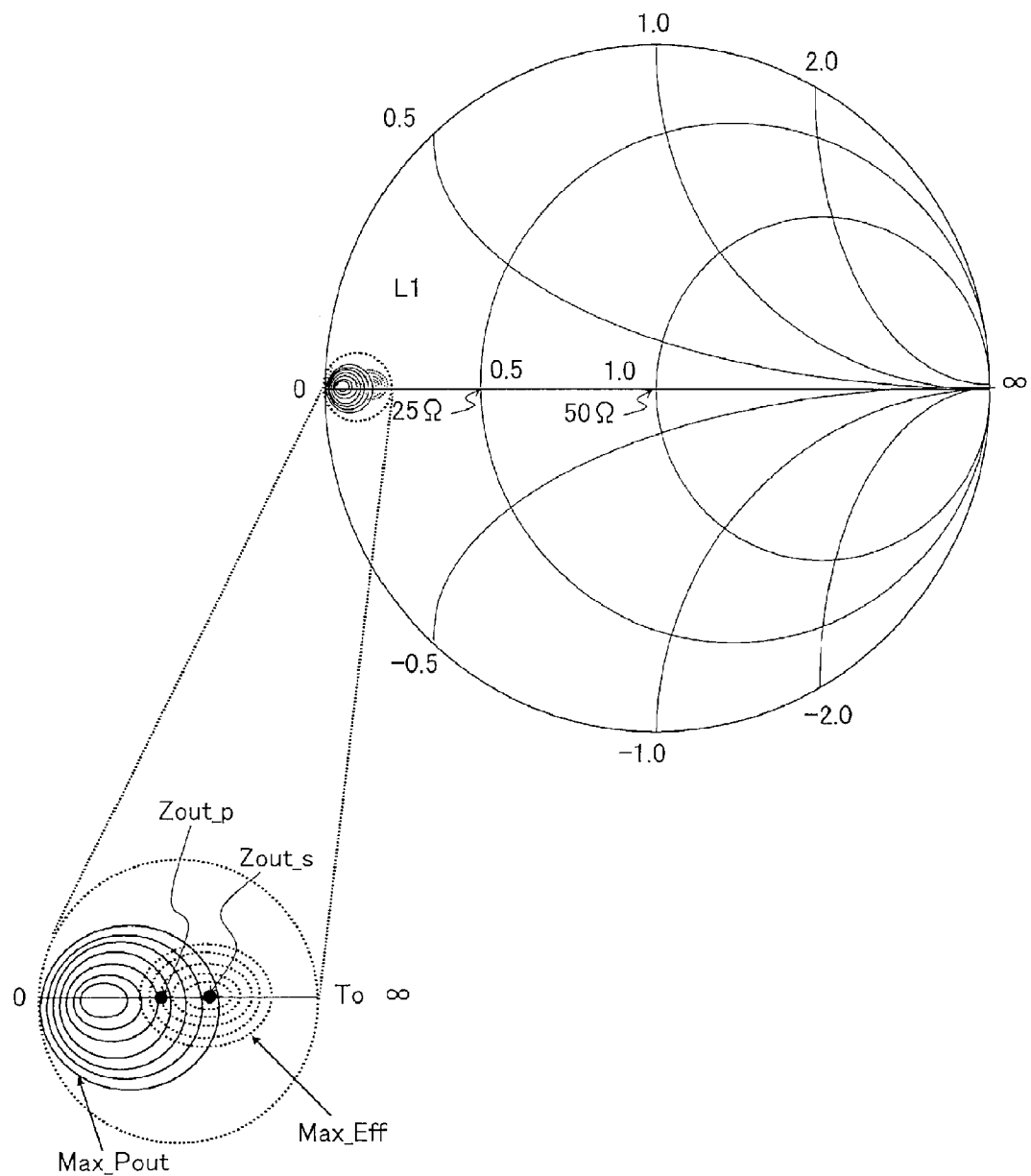
FIG. 2 is a diagram illustrating the operation of the power amplifier 1 according to the first preferred embodiment of the present invention illustrated in FIG. 1.

FIG. 2 is a diagram illustrating the operation of the power amplifier 1 according to the first preferred embodiment of the present invention illustrated in FIG. 1.

In other words, FIG. 2 illustrates a plot diagram of the maximum output power Max_Pout and a plot diagram of the maximum efficiency Max_Eff calculated from the output power and consumed current on the Smith chart at the time when the power amplifier 1 according to the first preferred embodiment of the present invention illustrated in FIG. 1 is in the period of executing the parallel amplification operations of the transistors Q1 and Q2.

First, the Smith chart illustrated in FIG. 2 includes a straight line connecting two points of the resistance of a resistor, which is the real part of an impedance, one point at a resistance of zero (0) and the other point at a resistance of infinity (∞), and includes a resistance circle corresponding to a resistance of zero, a resistance circle corresponding to a resistance of about 0.5 (about 25 Ω, for example), and a resistance circle corresponding to a resistance of about 1.0 (about 50 Ω, for example). Further, the Smith chart illustrated in FIG. 2 includes a reactance circular arc corresponding to a reactance of about 0.5, a reactance circular arc corresponding to a reactance of about 1.0, a reactance circular arc corresponding to a reactance of about 2.0, a reactance circular arc corresponding to a reactance of about −0.5, a reactance circular arc corresponding to a reactance of about −1.0, and a reactance circular arc corresponding to a reactance of about −2.0, where a reactance is the imaginary part of an impedance, for example.

A magnified chart of a left portion of the large Smith chart illustrated in FIG. 2 in the vicinity of a point where the resistance of a resistor is zero (0) is illustrated at the bottom left of FIG. 2. The plot diagram of the maximum efficiency Max_Eff includes concentric circles which are a plurality of constant-efficiency lines each representing a constant efficiency. The maximum efficiency Max_Eff is realized substantially at the center of the concentric circles which form the plot diagram of the maximum efficiency Max_Eff. The plot diagram of the maximum output power Max_Pout includes concentric circles which are a plurality of constant-output-power lines each representing a constant output power. The maximum output power Max_Pout is realized substantially at the center of the concentric circles which form the plot diagram of the maximum output power Max_Pout.

The Smith chart during a period when the power amplifier 1 according to the first preferred embodiment of the present invention illustrated in FIG. 1 is performing the stand-alone amplification operation of the transistor Q1 is substantially the same as the Smith chart illustrated in FIG. 2. However, in the Smith chart during the period when the stand-alone amplification operation of the transistor Q1 is performed, the position of the concentric circles of the maximum efficiency Max_Eff and the position of the concentric circles of the maximum output power Max_Pout move toward the resistance circle corresponding to about 0.5 (about 25 Ω) on the right side of the Smith chart illustrated in FIG. 2.

When it is assumed that the magnified diagram illustrated at the bottom left of FIG. 2 illustrates the operation during a period when the stand-alone amplification operation of the transistor Q1 is performed, the value of an output impedance Zout_s of the power amplifier 1 during the period when the stand-alone amplification operation of the transistor Q1 is performed is set to a relatively high value, i.e., about 2 Ω to about 3 Ω, so that the value of the output impedance Zout_s is positioned substantially at the center of the concentric circles of the maximum efficiency Max_Eff illustrated in the magnified diagram. Hence, during a period when the stand-alone amplification operation of the transistor Q1 is performed, the output impedance of the power amplifier 1 can be set in such a manner that importance is placed more on the maximum efficiency Max_Eff than on the maximum output power Max_Pout.

On the other hand, the magnified diagram illustrated at the bottom left of FIG. 2 is a magnified view of the Smith chart during a period when the parallel amplification operations of the transistors Q1 and Q2 of the power amplifier 1 are performed. However, it is understood that an output impedance Zout_p (set to a resistance of about 1 Ω to about 2 Ω) of the power amplifier 1 during a period when the parallel amplification operations of the transistors Q1 and Q2 of the power amplifier 1 are performed is not positioned substantially at the center of the concentric circles of the maximum output power Max_Pout illustrated in the magnified diagram of FIG. 2. In other words, the substantial center of the concentric circles of the maximum output power Max_Pout is shifted toward a point where the resistance is zero (0) from the output impedance Zout_p of about 1 Ω to about 2 Ω of the power amplifier 1 during the period of the parallel amplification operations. This makes it impossible to set the output impedance of the power amplifier 1 in such a manner that importance is placed more on the maximum output power Max_Pout than on the maximum efficiency Max_Eff during a period when the parallel amplification operations of the transistors Q1 and Q2 of the power amplifier 1 are performed.

Hence, the impedance adjusting circuit Zadj and the second switch circuit SW2 added to the power amplifier 1 according to the first preferred embodiment of the present invention realize very important functions and operations.

Figure 3:
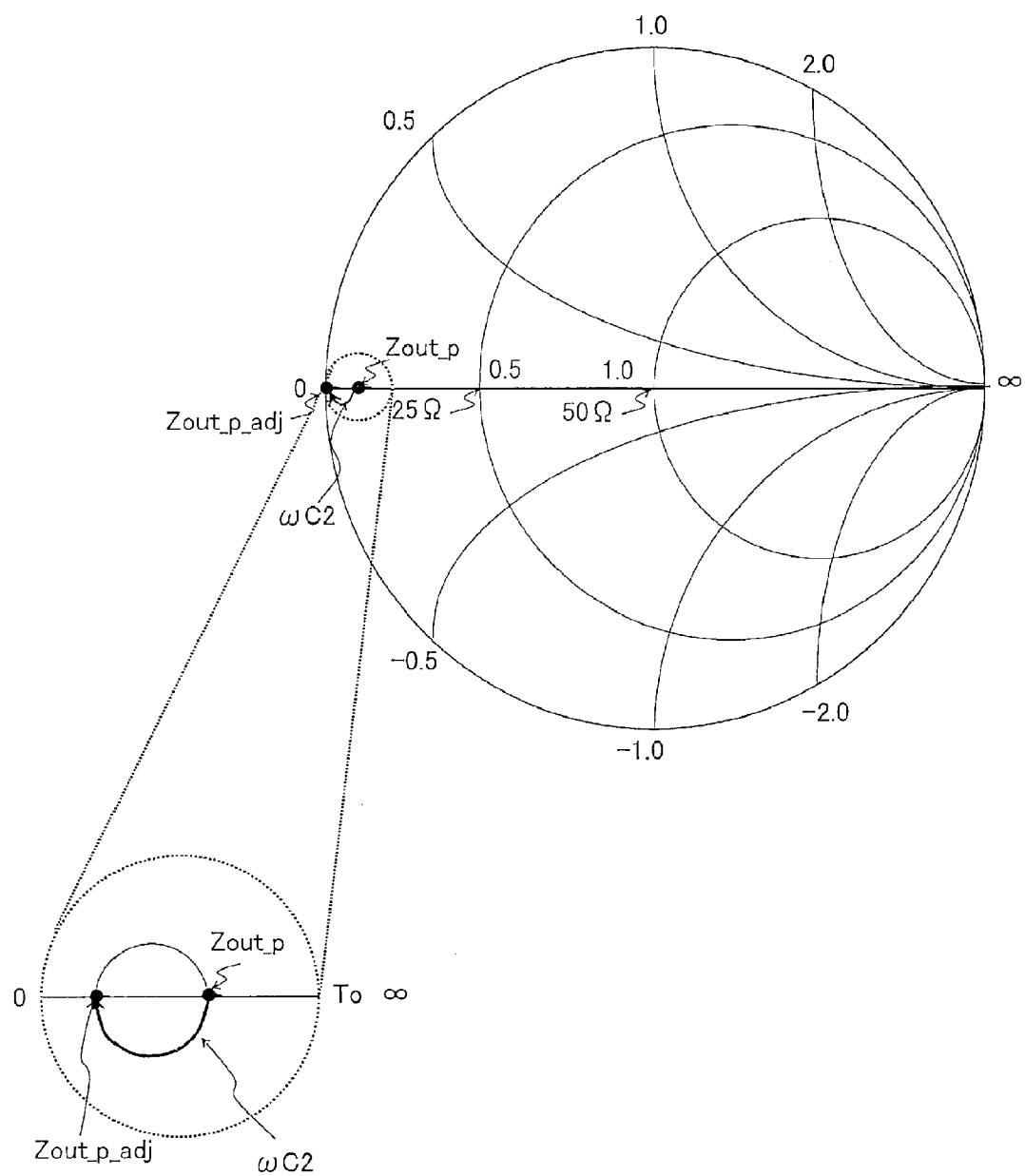
FIG. 3 is a diagram illustrating the operations of an impedance adjusting circuit Zadj and a second switch circuit SW2 included in the power amplifier 1 according to the first preferred embodiment of the present invention illustrated in FIG. 1.

FIG. 3 is a diagram illustrating the operations of the impedance adjusting circuit Zadj and the second switch circuit SW2 included in the power amplifier 1 according to the first preferred embodiment of the present invention illustrated in FIG. 1.

In other words, FIG. 3 is a diagram illustrating how an adjusted output impedance Zout_p_adj moves to the substantial center of the concentric circles of the maximum output power Max_Pout by the operations of the impedance adjusting circuit Zadj and the second switch circuit SW2 during a period when the parallel amplification operations of the transistors Q1 and Q2 of the power amplifier 1 according to the first preferred embodiment of the present invention illustrated in FIG. 1 are performed.

Also at the bottom left of FIG. 3, a magnified diagram of an area of the large Smith chart illustrated in FIG. 3 near a point where the resistance of a resistor is zero (0) is illustrated.

Even if the power amplifier 1 starts execution of the parallel amplification operations of the transistors Q1 and Q2 in response to the power mode signal PM at a high level "1", the impedance adjusting circuit Zadj is controlled so as to be in an inactive state when the transistor Q5 of the second switch circuit SW2 is in an off state. The output impedance Zout_p of the power amplifier 1 during a period when the parallel amplification operations of the transistors Q1 and Q2 are performed in the case where the impedance adjusting circuit Zadj is in an inactive state is relatively high, i.e., about 1 Ω to about 2 Ω. This does not allow the output impedance Zout_p to be positioned at the substantial center of the concentric circles of the maximum output power Max_Pout illustrated in the magnified diagram of FIG. 2.

On the other hand, according to the power amplifier 1 of the first preferred embodiment of the present invention illustrated in FIG. 1, the transistor Q5 of the second switch circuit SW2 is turned on substantially at the same time as the power amplifier 1 starts execution of the parallel amplification operations of the transistors Q1 and Q2 in response to the power mode signal PM at a high level "1", such that the impedance adjusting circuit Zadj is controlled so as to be in an active state. As a result, the output impedance of the power amplifier is changed from the initial output impedance Zout_p to the adjusted output impedance Zout_p_adj by the function of the capacitor C2 included in the impedance adjusting circuit Zadj.

In other words, due to the function of the capacitor C2 of the impedance adjusting circuit Zadj, the output impedance of the power amplifier 1 during a period when the parallel amplification operations of the transistors Q1 and Q2 are performed starts from the initial output impedance Zout_p and moves in the clockwise direction along a constant-conductance circle arc. The amount of movement at this time is $\omega C2$ which corresponds to the admittance $j\omega C2$ of the capacitor C2. It should be noted that $\omega$ is an angular frequency.

Hence, the amount $\omega C2$ of the movement is set in such a manner that the adjusted output impedance Zout_p_adj as an impedance at the movement destination is positioned at the substantial center of the concentric circles of the maximum output power Max_Pout illustrated in FIG. 2.

As described above, according to the power amplifier 1 of the first preferred embodiment of the present invention illustrated in FIG. 1, it becomes possible to set the output impedance of the power amplifier 1 in such a manner that importance is placed more on the maximum output power Max_Pout than on the maximum efficiency Max_Eff during a period when the parallel amplification operations of the transistors Q1 and Q2 are performed.

Hence, according to the power amplifier 1 of the first preferred embodiment of the present invention illustrated in FIG. 1, it becomes possible to achieve the initial objective of optimizing the output impedance of the power amplifier 1 during a period when the parallel amplification operations of the transistors Q1 and Q2 are performed.

Further, according to the power amplifier 1 of the first preferred embodiment of the present invention illustrated in FIG. 1, the first switch circuit SW1 that switches between the stand-alone amplification operation of the transistor Q1 and the parallel amplification operations of the transistors Q1 and Q2 is realized using two devices, i.e., the transistor Q3 and the resistor R2. Hence it becomes possible to achieve the initial objective of reducing the chip area occupied by the switch circuit that switches between the stand-alone amplification operation and the parallel amplification operations.

The operation of switching between the stand-alone amplification operation of the transistor Q1 and the parallel amplification operations of the transistors Q1 and Q2 in the power amplifier 1 according to the first preferred embodiment of the present invention illustrated in FIG. 1 will be more accurately described below.

In other words, when the stand-alone amplification operation of the transistor Q1 is switched to the parallel amplification operations of the transistors Q1 and Q2, the plot diagram of the maximum output power Max_Pout including a plurality of constant-power-output lines and the plot diagram of the maximum efficiency Max_Eff including a plurality of constant-efficiency lines shift to the bottom left in the Smith chart illustrated in FIG. 2. Hence, when switching to the parallel amplification operations of the transistors Q1 and Q2 is performed, the transistor Q5 of the second switch circuit SW2 is turned on and the impedance adjusting circuit Zadj is controlled so as to be in an active state.

As a result, due to the function of the capacitor C2 of the impedance adjusting circuit Zadj, the output impedance of the power amplifier 1 during a period when the parallel amplification operations of the transistors Q1 and Q2 are performed starts from the initial output impedance Zout_p and moves in the clockwise direction along a constant-conductance circle arc, where the amount of movement is $\omega C2$. Hence, the adjusted output impedance Zout_p_adj which has been adjusted by the function of the capacitor C2 of the impedance adjusting circuit Zadj becomes positioned substantially at the mid-point between the point of the maximum efficiency Max_Eff and the point of the maximum output power Max_Pout. As a result, according to the power amplifier 1 of the first preferred embodiment of the present invention illustrated in FIG. 1, it becomes possible to realize preferable power amplification characteristics with balanced power efficiency and output power.

However, in an intermediate design stage prior to the full completion of the present invention, the impedance adjusting circuit Zadj included only the capacitor C2 and did not include the inductor L2.

It was clarified by the study carried out by the inventors and others that in the case where the impedance adjusting circuit Zadj includes only the capacitor C2 and does not include the inductor L2, there is a problem in that the RF output signal obtained at the RF output signal terminal "RF output" of the output matching circuit MN_C of the power amplifier 1 includes not only the fundamental frequency component but also high-level second-harmonic and third-harmonic components.

Figure 4:
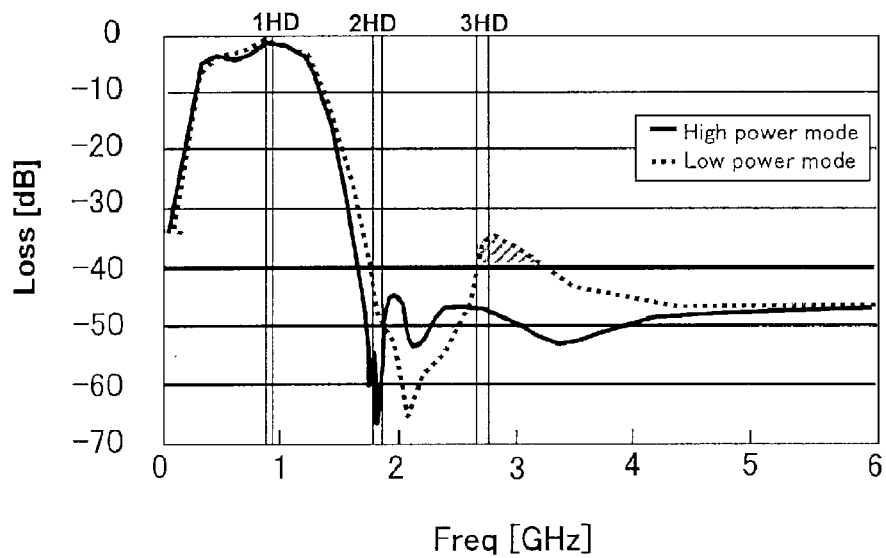
FIG. 4 is a diagram illustrating the attenuation characteristics for a second-harmonic component and a third-harmonic component output from the RF output signal terminal of an output matching circuit MN_C in the case where the impedance adjusting circuit Zadj of the power amplifier 1 according to the first preferred embodiment of the present invention illustrated in FIG. 1 includes only a capacitor C2 and does not include an inductor L2.

FIG. 4 is a diagram illustrating the attenuation characteristics for a second-harmonic component and a third-harmonic component output from the RF output signal terminal of the output matching circuit MN_C in the case where the impedance adjusting circuit Zadj of the power amplifier 1 according to the first preferred embodiment of the present invention illustrated in FIG. 1 includes only the capacitor C2 and does not include the inductor L2.

The vertical axis in FIG. 4 represents attenuation between the input terminal and output terminal of the output matching circuit MN_C and the horizontal axis in FIG. 4 represents frequency.

A fundamental wave component (1HD) in FIG. 4 represents transmission frequencies from 824 MHz to 849 MHz of GSM (registered trademark) 850 and transmission frequencies from 880 MHz to 915 MHz of GSM 900, a second-harmonic component (2HD) in FIG. 4 represents frequencies from 1648 MHz to 1698 MHz, which are twice the transmission frequencies of GSM 850, and from 1760 MHz to 1830 MHZ, which are twice the transmission frequencies of GSM 900, and a third-harmonic component (3HD) in FIG. 4 represents frequencies from 2472 MHz to 2547 MHz, which are three times the transmission frequencies of GSM 850 and frequencies from 2640 MHz to 2745 MHz, which are three times the transmission frequencies of GSM 900. In the target specifications, the attenuated level of the second harmonic component (2HD) and the third-harmonic component (3HD) is −40 dB or below. However, the study by the inventors and others clarified a problem in that the attenuated level of −40 dB or below, which is the specified target, is not achieved in the case of a low-power mode illustrated by a dotted line in FIG. 4 (that is, when the power mode signal PM is at a low level "0" and the transistor Q1 is performing a stand-alone amplification operation).

Since the transmission frequencies of DCS 1800 are from 1710 MHz to 1785 MHz and the transmission frequencies of PCS 1900 are from 1850 MHz to 1910 MHz, it is understood that the second-harmonic component (2HD) corresponding to 1760 MHz to 1830 MHz, which are twice the transmission frequencies of GSM 900, becomes an interference radio wave for the transmission frequencies from 1710 MHz to 1785 MHz of DCS 1800. It should be noted that GSM stands for Global System for Mobile Communication, DCS stands for Digital Cellular System, and PCS stands for Personal Communication System. In the case of a low power mode illustrated by a dotted line in FIG. 4, the attenuation becomes the worst near the third-harmonic component (3HD), and a harmonic near this frequency does not become an interference radio wave for the transmission frequencies from 1710 MHz to 1785 MHz of DCS 1800 or an interference radio wave for the transmission frequencies from 1850 MHz to 1910 MHz of DCS 1900, but may become an interference radio wave for other communication systems.

The solid line in FIG. 4 illustrates the attenuation characteristics in a high-power mode (i.e., the power mode signal PM is at a high level "1" and the parallel amplification operations of the transistors Q1 and Q2 are performed). It is understood that −40 dB or below, which is the specified target, is achieved as the attenuated level of a second-harmonic component (2HD) and a third-harmonic component (3HD).

The inventors and others studied the reason why −40 dB or below, which is the specified target, cannot be achieved as the attenuated level of harmonics in the low-power mode illustrated by a dotted line in FIG. 4, and reached the conclusion described below.

The conclusion is that, in the low-power mode, the transistor Q5 of the second switch circuit SW2 connected between the impedance adjusting circuit Zadj and the ground potential GND is controlled by the power mode signal PM at a low level "0" so as to be in an off state, and the transistor Q5 in an off state generates waveform distortion causing harmonics in the low-power mode. That is, since a high-voltage-amplitude RF signal is generated at the connection node between the drains of the transistors Q1 and Q2 that is connected to the load device inductor L1, this high-amplitude RF output signal is supplied to the drain of the transistor Q5 of the second switch circuit SW2 through the capacitor C2 of the impedance adjusting circuit Zadj.

The study by the inventors and others clarified that during negative half cycles of the high-amplitude RF output signal, the drain signal waveform of the transistor Q5 is clamped at a predetermined negative voltage, and high-level harmonics are generated due to the clamp. The reason is thought to be as follows.

That is, since the p-type well region (p-type substrate) of the transistor Q5, which is an n-channel MOS transistor, is connected to the ground potential GND together with the n-type source region, when a negative voltage is applied to the n-type drain region of the transistor Q5, a parasitic diode defined by the p-type well region and the n-type drain region is turned on, such that the negative voltage clamp is generated.

Hence, in the power amplifier 1 according to the first preferred embodiment of the present invention illustrated in FIG. 1, the effect of the negative voltage clamp due to the parasitic diode of the transistor Q5 is reduced by the function of applying a positive voltage realized by the resistor R3 connected between the drain of the transistor Q5 of the second switch circuit SW2 and the positive power supply voltage VDD.

However, even when the resistor R3 of the second switch circuit SW2 is added, the negative voltage clamp due to the parasitic diode of the transistor Q5 cannot be completely prevented, and generation of harmonics in the low-power mode, illustrated by the dotted line in FIG. 4, in which the transistor Q5 of the second switch circuit SW2 is controlled so as to be in an off state cannot be prevented.

Hence, in the power amplifier 1 according to the first preferred embodiment of the present invention, the inductor L2 connected in series with the capacitor C2 in the impedance adjusting circuit Zadj realizes very important functions and operations. For example, the capacitance of the capacitor C2 and the inductance of the inductor L2 are set in such a manner that the serial resonant frequency of the capacitor C2 and the inductor L2 substantially becomes the mid-frequency between the fundamental wave component (1HD) and the second-harmonic component (2HD).

Figure 5:
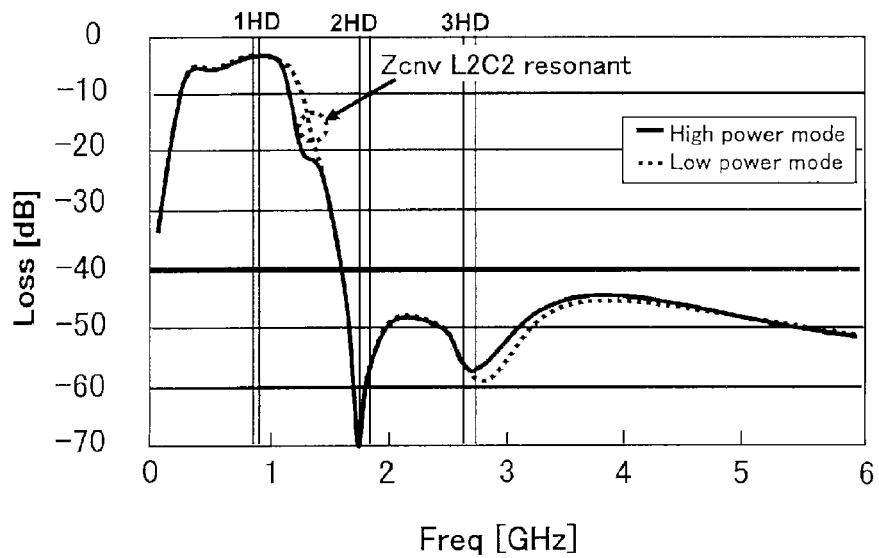
FIG. 5 is a diagram illustrating the attenuation characteristics for a second-harmonic component and a third-harmonic component output from the RF output signal terminal of the output matching circuit MN_C in the case where the impedance adjusting circuit Zadj of the power amplifier 1 according to the first preferred embodiment of the present invention illustrated in FIG. 1 includes the capacitor C2 and the inductor L2.

FIG. 5 is a diagram illustrating the attenuation characteristics for a second-harmonic component and a third-harmonic component output from the RF output signal terminal of the output matching circuit MN_C in the case where the impedance adjusting circuit Zadj of the power amplifier 1 according to the first preferred embodiment of the present invention illustrated in FIG. 1 includes the capacitor C2 and the inductor L2.

Referring to FIG. 5, it is understood that in both cases of the high-power mode illustrated by the solid line and the low-power mode illustrated by the dotted line, −40 dB or below, which is the specified target, is achieved as the attenuated level of harmonics including the second harmonic component (2HD) and the third-harmonic component (3HD). The reason is thought to be as follows.

The reason is that addition of the inductor L2 to the impedance adjusting circuit Zadj improves the quality factor of the low pass filter characteristics of the output matching unit (MN) 20 that includes the output matching circuit MN_C, the impedance adjusting circuit Zadj, and the second switch circuit SW2.

Actually, as is clear from FIG. 5, while the attenuation in the fundamental wave component (1HD) is set to a low value, in the harmonics including the second harmonic component (2HD) and the third-harmonic component (3HD) high attenuation is realized that is −40 dB or below, which is the specified target.

Figure 6A:
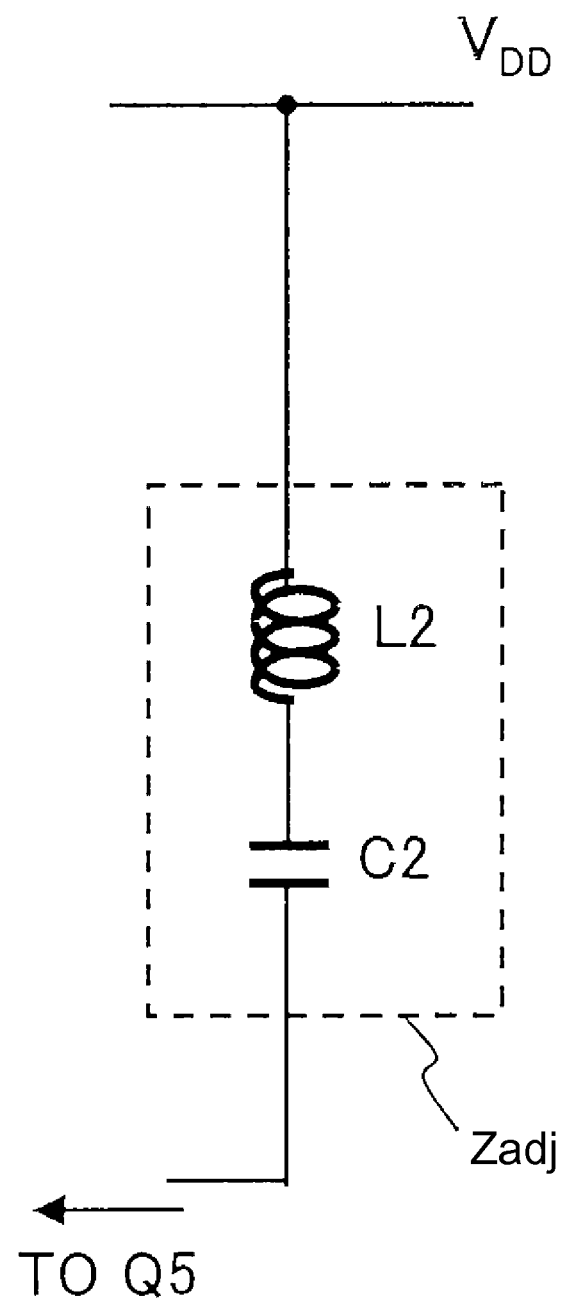
FIG. 6A is a diagram illustrating another configuration of the impedance adjusting circuit Zadj of the power amplifier 1 according to the first preferred embodiment of the present invention illustrated in FIG. 1.
Figure 6B:
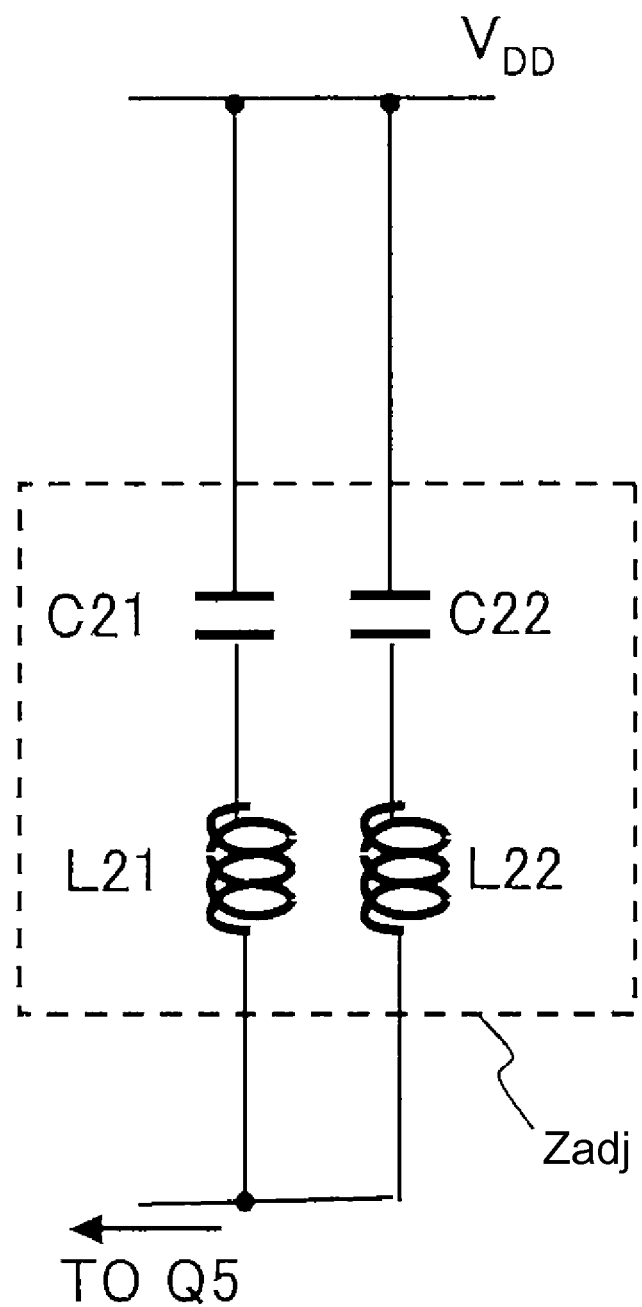
FIG. 6B is a diagram illustrating another configuration of the impedance adjusting circuit Zadj of the power amplifier 1 according to the first preferred embodiment of the present invention illustrated in FIG. 1.
Figure 6C:
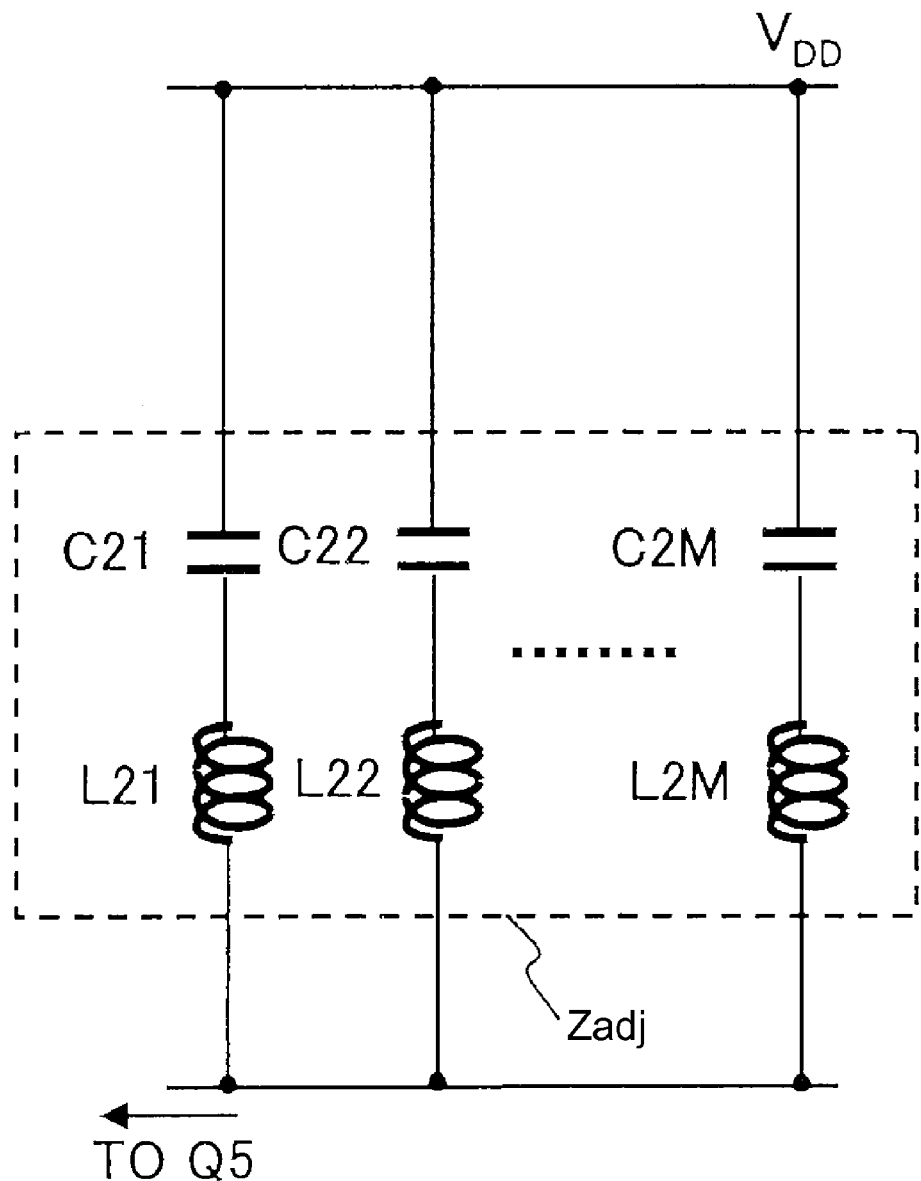
FIG. 6C is a diagram illustrating another configuration of the impedance adjusting circuit Zadj of the power amplifier 1 according to the first preferred embodiment of the present invention illustrated in FIG. 1.

FIG. 6A to FIG. 6C are diagrams illustrating other configurations of the impedance adjusting circuit Zadj of the power amplifier 1 according to the first preferred embodiment of the present invention illustrated in FIG. 1.

An impedance adjusting circuit Zadj illustrated in FIG. 6A is a circuit in which the order in which the capacitor C2 and the inductor L2 are connected in series in the impedance adjusting circuit Zadj illustrated in FIG. 1 is reversed.

An impedance adjusting circuit Zadj illustrated in FIG. 6B is configured to include two circuits connected in parallel, each including a capacitor and an inductor connected in series. In other words, the impedance adjusting circuit Zadj illustrated in FIG. 6B includes a parallel connection of a first serial connection of a capacitor C21 and an inductor L21 and a second serial connection of a capacitor C22 and an inductor L22.

An impedance adjusting circuit Zadj illustrated in FIG. 6C includes a parallel connection of three or more serial connections of capacitors and inductors. In other words, the impedance adjusting circuit Zadj illustrated in FIG. 6C includes a parallel connection of a first serial connection of a capacitor C21 and an inductor L21, a second serial connection of a capacitor C22 and an inductor L22, and an Mth serial connection of a capacitor C2M and an inductor L2M.

Figure 8:
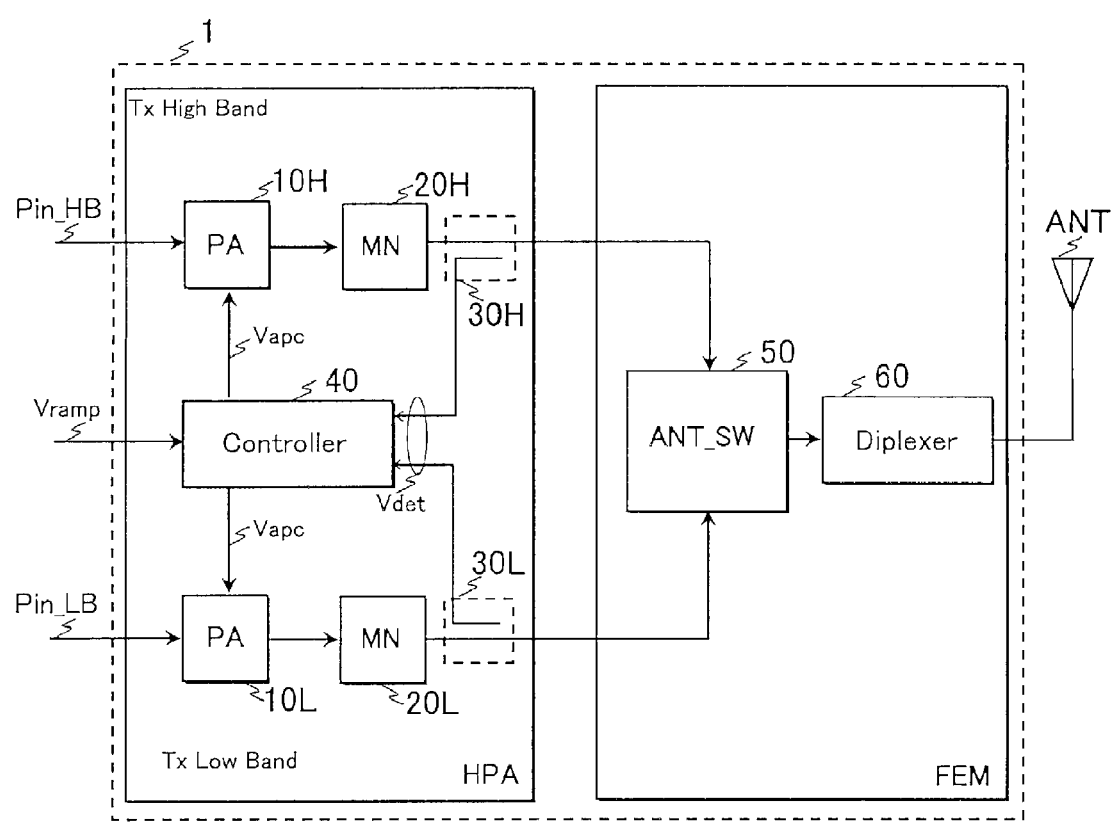
FIG. 8 is a diagram illustrating the configuration of a high-frequency module 1 that houses the power amplifier 1 according to the first preferred embodiment of the present invention illustrated in FIG. 1.

FIG. 8 is a diagram illustrating the configuration of a high-frequency module 1 that houses the power amplifier 1 according to the first preferred embodiment of the present invention illustrated in FIG. 1.

The high-frequency module 1 according to the first preferred embodiment of the present invention illustrated in FIG. 8 includes therein a dual-band high-frequency power amplifier HPA and a front-end module FEM.

When compared with a front-end module FEM which is externally connected to a dual-band high-frequency power amplifier HPA housed in a high-frequency module 1 according to a second preferred embodiment of the present invention illustrated in FIG. 9 described in detail later, the front-end module FEM housed in the high-frequency module 1 according to the first preferred embodiment of the present invention illustrated in FIG. 8 does not include a low pass filter (LPF) 70H and a low pass filter (LPF) 70L illustrated in FIG. 9. The functions of the low pass filter (LPF) 70H and the low pass filter (LPF) 70L illustrated in FIG. 9 are to output the fundamental wave component (1HD) included in an RF transmission output signal in such a manner that the fundamental wave component (1HD) is attenuated as little as possible, and to suppress the harmonics such as the second harmonic component (2HD) and the third-harmonic component (3HD) by attenuating the harmonics as much as possible.

Figure 9:
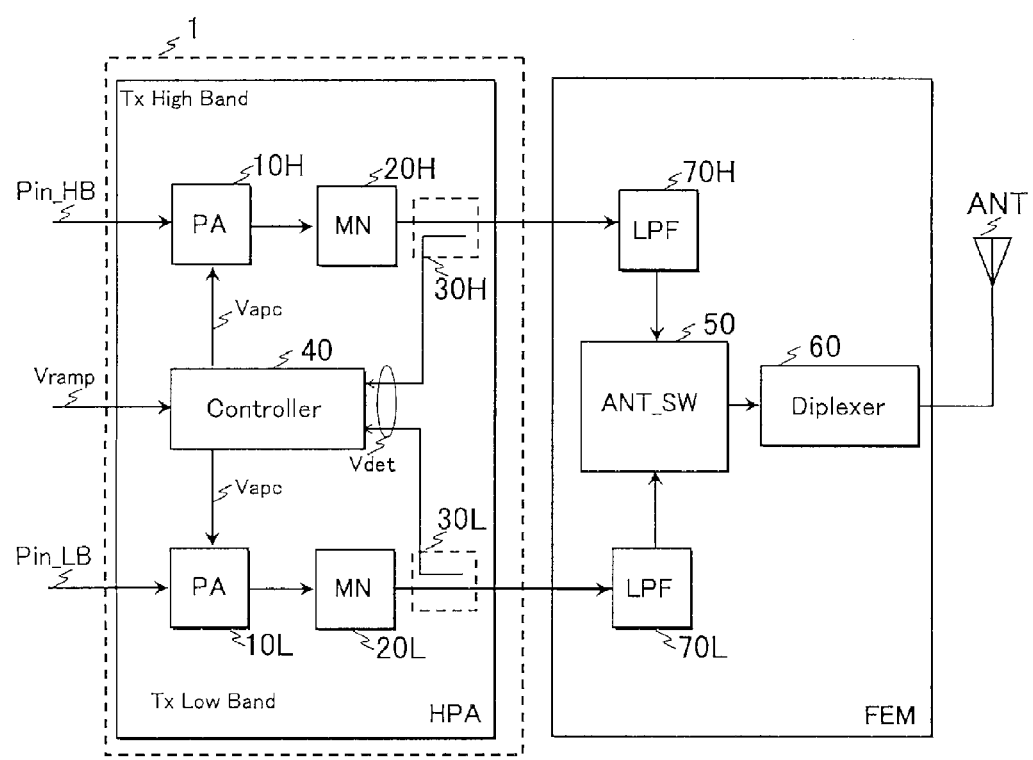
FIG. 9 is a diagram illustrating the configuration of a high-frequency module 1 that houses the power amplifier 1 according to the second preferred embodiment of the present invention illustrated in FIG. 7.

Hence, the first output matching unit (MN) 20H and the second output matching unit (MN) 20L housed in the high-frequency module 1 according to the first preferred embodiment of the present invention illustrated in FIG. 8 realize a function of output impedance matching and a function of suppressing the harmonics performed by the low pass filter (LPF) 70H and the low pass filter (LPF) 70L illustrated in FIG. 9.

On the other hand, the dual-band high-frequency power amplifier HPA of the high-frequency module 1 according to the first preferred embodiment of the present invention illustrated in FIG. 8 includes a first power amplifier unit (PA) 10H, a first output matching unit (MN) 20H, a second power amplifier unit (PA) 10L, a second output matching unit (MN) 20L, a first power coupling unit 30H, a second power coupling unit 30L, and a controller 40. A high-band first RF transmission input signal Pin_HB of DCS 1800 whose transmission frequencies are from 1710 to 1785 MHz and PCS 1900 whose transmission frequencies are from 1850 to 1910 MHz are input to a first RF signal input terminal of the first power amplifier unit (PA) 10H. A low-band second RF transmission input signal Pin_LB of GSM 850 whose transmission frequencies are from 824 MHz to 849 MHz and GSM 900 whose transmission frequencies are from 880 MHz to 915 MHz is input to a second RF signal input terminal of the second power amplifier unit (PA) 10L. The high-band first RF transmission input signal Pin_HB and the low-band second RF transmission input signal Pin_LB are supplied from the transmission signal processing unit of the RF signal processing semiconductor integrated circuit (RFIC) mounted in a cellular phone terminal. A ramp voltage Vramp for automatic power control from the RF signal processing semiconductor integrated circuit (RFIC) and a power detection voltage Vdet from the first power coupling unit 30H or the second power coupling unit 30L are supplied to the controller 40, whereby an automatic power control voltage Vapc is generated and supplied to the first power amplifier unit (PA) 10H and the second power amplifier unit (PA) 10L. The amplification gains of the first power amplifier unit (PA) 10H and the second power amplifier unit (PA) 10L are controlled by an automatic power control voltage Vapc in such a manner that the voltage of the power detection voltage Vdet becomes the same as the target ramp voltage Vramp through automatic power control. Specifically, in the power amplifier unit (PA) 10 illustrated in FIG. 1, the bias current Bias flowing through the drain-source current path of the transistor Q4 changes in accordance with a change in the automatic power control voltage Vapc, such that the control of the amplification gains for the automatic power control is performed. Hence, the first power amplifier unit (PA) 10H and the second power amplifier unit (PA) 10L included in the dual band high-frequency power amplifier HPA of the high-frequency module 1 according to the first preferred embodiment of the present invention illustrated in FIG. 8 are configured to have the circuit configuration of the power amplifier unit (PA) 10 illustrated in FIG. 1.

The first RF transmission output signal generated from the output of the first power amplifier unit (PA) 10H of the dual-band high-frequency power amplifier HPA of the high-frequency module 1 according to the first preferred embodiment of the present invention illustrated in FIG. 8 is supplied to one input terminal of an antenna switch (ANT_SW) 50 of the front-end module FEM through the first output matching unit (MN) 20H and the first power coupling unit 30H. Further, the second RF transmission output signal generated from the output of the second power amplifier unit (PA) 10L of the dual-band high-frequency power amplifier HPA is supplied to the other input terminal of the antenna switch (ANT_SW) 50 of the front-end module FEM through the second output matching unit (MN) 20L and the second power coupling unit 30L.

As described above, the front-end module FEM housed in the high-frequency module 1 according to the first preferred embodiment of the present invention illustrated in FIG. 8 does not include the low pass filter (LPF) 70H and the low pass filter (LPF) 70L illustrated in FIG. 9. Hence, the first output matching unit (MN) 20H and the second output matching unit (MN) 20L housed in the high-frequency module 1 according to the first preferred embodiment of the present invention illustrated in FIG. 8 preferably realize the output impedance matching function and the harmonic suppression function of the low pass filter (LPF) 70H and the low pass filter (LPF) 70L illustrated in FIG. 9. For this reason, the first output matching unit (MN) 20H and the second output matching unit (MN) 20L housed in the high-frequency module 1 according to the first preferred embodiment of the present invention illustrated in FIG. 8 are configured to have the circuit configuration of the output matching unit (MN) 20 illustrated in FIG. 1. As a result, as described in FIG. 5, while the attenuation of the fundamental wave component (1HD) is set to a low level, high attenuation can be realized for harmonics such as the second harmonic component (2HD) and the third-harmonic component (3HD).

Second Preferred Embodiment

FIG. 7 is a diagram illustrating another configuration of a power amplifier 1 according to a second preferred embodiment of the present invention.

The power amplifier 1 according to the second preferred embodiment of the present invention illustrated in FIG. 7 is different from the power amplifier 1 according to the first preferred embodiment of the present invention in terms of the following points.

That is, in the power amplifier 1 according to the second preferred embodiment of the present invention illustrated in FIG. 7, the position to which the impedance adjusting circuit Zadj is connected is different from that in the power amplifier 1 according to the first preferred embodiment of the present invention illustrated in FIG. 1. In the power amplifier 1 according to the first preferred embodiment of the present invention illustrated in FIG. 1, the impedance adjusting circuit Zadj is connected between the drain of the transistor Q5 of the second switch circuit SW2 and the mutually connected drains of the transistors Q1 and Q2 of the power amplifier unit (PA) 10, i.e., the input terminal of the output matching circuit MN_C.

On the other hand, in the power amplifier 1 according to the second preferred embodiment of the present invention illustrated in FIG. 7, the impedance adjusting circuit Zadj is connected between the RF output signal terminal "RF output" of the output matching circuit MN_C and the drain of the transistor Q5 of the second switch circuit SW2. There are no differences between the two in terms of the rest of the circuit connection.

In either of the power amplifier 1 according to the first preferred embodiment of the present invention illustrated in FIG. 1 and the power amplifier 1 according to the second preferred embodiment of the present invention illustrated in FIG. 7, the amplitude of the RF signal at the output matching circuit MN_C changes in the following sequence. That is, the RF signal voltage amplitude at the first intermediate node which is a connection node between the inductor LMN1 and the inductor LMN3 becomes larger than the RF signal voltage amplitude of the mutually connected drains of transistors Q1 and Q2 of the power amplifier unit (PA) 10 i.e., the input terminal of the output matching circuit MN_C. Further, the RF signal voltage amplitude at the second intermediate node which is a connection node between the inductor LMN3 and the inductor LMN5 becomes larger than the RF signal voltage amplitude at the first intermediate node which is the connection node between the inductor LMN1 and the inductor LMN3. Further, the RF signal voltage amplitude at the third intermediate node which is a connection node between the inductor LMN5 and the inductor LMN7 becomes larger than the RF signal voltage amplitude at the second intermediate node which is the connection node between the inductor LMN3 and the inductor LMN5. Further, the RF signal voltage amplitude of the RF output signal terminal "RF output" of the output matching circuit MN_C becomes larger than the RF signal voltage amplitude at the third intermediate node which is the connection node between the inductor LMN5 and the inductor LMN7.

The reason for this is that the output matching circuit MN_C has a function of impedance matching between a low output impedance of about several $\Omega$ at the mutually connected drains of the transistors Q1 and Q2 of the power amplifier unit (PA) 10 and a high impedance of about 50 $\Omega$ at the transmission antenna of a cellular phone communication terminal. In other words, the impedance gradually increases from several $\Omega$ to about 50 $\Omega$ at the following positions in sequence: the input terminal of the output matching circuit MN_C, the first intermediate node, the second intermediate node, the third intermediate node, and the RF output signal terminal "RF output".

Hence, in the power amplifier 1 according to the first preferred embodiment of the present invention illustrated in FIG. 1, the minimum RF signal voltage amplitude of the mutually connected drains of the transistors Q1 and Q2 of the power amplifier unit (PA) 10, i.e., the input terminal of the output matching circuit MN_C is applied to the drain of the transistor Q5 of the second switch circuit SW2. This application of the minimum RF signal voltage amplitude allows suppression of harmonics generated from the transistor Q5 in an off state, in the first preferred embodiment of the present invention illustrated in FIG. 1.

On the other hand, in the second preferred embodiment of the present invention illustrated in FIG. 7, the maximum RF signal voltage amplitude of the output matching circuit MN_C is applied to the drain of the transistor Q5 of the second switch circuit SW2. This application of the maximum RF signal voltage amplitude has a problem in that harmonic components generated from the transistor Q5 in an off state according to the second preferred embodiment of the present invention illustrated in FIG. 7 becomes larger than harmonic components generated from the transistor Q5 in an off state according to the first preferred embodiment of the present invention illustrated in FIG. 1.

However, this problem can be easily solved by the front-end module FEM externally connected to the dual-band high-frequency power amplifier HPA housed in the high-frequency module 1 according to the second preferred embodiment of the present invention illustrated in FIG. 9.

FIG. 9 is a diagram illustrating the configuration of a high-frequency module 1 that houses the power amplifier 1 according to the second preferred embodiment of the present invention illustrated in FIG. 7.

When compared with the front-end module FEM housed in the power amplifier 1 according to the first preferred embodiment of the present invention illustrated in FIG. 8, the low pass filter (LPF) 70H and the low pass filter (LPF) 70L have been added to the front-end module FEM illustrated in FIG. 9. The functions of the low pass filter (LPF) 70H and the low pass filter (LPF) 70L illustrated in FIG. 9 are to output the fundamental wave component (1HD) included in an RF transmission output signal in such a manner that the fundamental wave component (1HD) is attenuated as little as possible, and to suppress the harmonics such as the second harmonic component (2HD) and the third-harmonic component (3HD) by attenuating the harmonics as much as possible.

As a result, the problem of harmonics being generated from the transistor Q5 in an off state according to the second preferred embodiment of the present invention illustrated in FIG. 7 is easily solved by the front-end module FEM illustrated in FIG. 9.

On the other hand, also in the power amplifier 1 according to the second preferred embodiment of the present invention illustrated in FIG. 7, the impedance gradually increases from several Ω to about 50 Ω at the following positions in sequence: the input terminal of the output matching circuit MN_C, the first intermediate node, the second intermediate node, the third intermediate node, and the RF output signal terminal "RF output".

Regarding a position to which the impedance adjusting circuit Zadj is connected, the study by the inventors and others confirmed that power loss is smaller in the case where the impedance adjusting circuit Zadj is connected between the RF output signal terminal "RF output" of the output matching circuit MN_C and the drain of the transistor Q5 of the second switch circuit SW2, as illustrated in FIG. 7, than in the case of FIG. 1.

In other words, when the transistors Q1 and Q2 perform parallel amplification operations on the RF input signal "RF input" in response to the power mode signal PM at a high level "1", the transistor Q5 of the second switch circuit SW2 is controlled so as to be in an on state in response to the power mode signal PM at a high level "1". Hence, the impedance adjusting circuit Zadj is controlled so as to be in an active state as a result of the transistor Q5 of the second switch circuit SW2 being controlled so as to be in an on state, and a current flows through the impedance adjusting circuit Zadj and the second switch circuit SW2, whereby power loss is generated.

The study by the inventors and others clarified that the power loss of the impedance adjusting circuit Zadj and the second switch circuit SW2 is lower in the case of FIG. 7 than in the case of FIG. 1 since the impedance of the output matching circuit MN_C at the position where the impedance adjusting circuit Zadj is connected is higher in the case of FIG. 7 than in the case of FIG. 1. Hence, the current consumption and the power consumption can be decreased more in FIG. 7 than in FIG. 1.

Hence, the power amplifier 1 according to the second preferred embodiment of the present invention illustrated in FIG. 7, having characteristics of the power loss, the current consumption, and the power consumption in the high-power mode being low although having a disadvantage that a large amount of harmonics is generated, is used in combination with the front-end module FEM to which the low pass filter (LPF) 70H and the low pass filter (LPF) 70L having the function of attenuating harmonics have been added, as illustrated in FIG. 9.

Note that, although not described at the beginning, MOS transistors called LD-type MOS transistors appropriate for high-frequency amplification and high-output amplification are used as the n-channel MOS transistors Q1, Q2, Q3, Q4, and Q5 included in the power amplifier unit (PA) 10. Here, "LD" stands for "laterally diffused".

Although the present invention developed, conceived of and made by the inventors have been described in detail above on the basis of various preferred embodiments, the present invention is not limited to the preferred embodiments and various modifications are possible within the scope of the invention.

For example, in the dual-band high-frequency power amplifier HPA of the high-frequency module 1 according to the first preferred embodiment of the present invention illustrated in FIG. 8, directional couplers are preferably used as the first power coupling unit 30H and the second power coupling unit 30L for power detection. However, other power detection methods which can be used include a current-sensing-type power detection method. In the current-sensing-type power detection method, a detection transistor with a small device size is preferably connected in parallel with the output transistor of a power amplifier, and the power is detected on the basis of a low detection AC/DC operation current which flows through the detection transistor and which is proportional to the AC/DC operation current of the output transistor.

Further, for example, in the power amplifier 1 according to the first preferred embodiment of the present invention illustrated in FIG. 1, instead of connecting the impedance adjusting circuit Zadj to the mutually connected drains of the transistors Q1 and Q2, the impedance adjusting circuit Zadj may be connected to the first intermediate node, which is a connection node between the inductor LMN 1 and the inductor LMN 3, by changing the connection position.

Further, for example, in the power amplifier 1 according to the second preferred embodiment of the present invention illustrated in FIG. 7, instead of connecting the impedance adjusting circuit Zadj to the RF output signal terminal "RF output" of the output matching circuit MN_C, the impedance adjusting circuit Zadj may be connected to the third intermediate node, which is a connection node between the inductor LMN 5 and the inductor LMN 7, by changing the connection position.

Further, as the n-channel MOS transistors Q1, Q2, Q3, Q4, and Q5 included in the power amplifier unit (PA) 10, hetero junction bipolar transistors (HBTs) or n-channel field effect transistors such as MESFETs and HEMTs using GaAs or InP may be used, other than LD-type n-channel MOS transistors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power amplifier comprising:
   an RF signal input terminal;
   a first amplifier device;
   a second amplifier device;
   a load device;
   a first switch circuit;

a second switch circuit; and
an impedance adjusting circuit; wherein
a common electrode of the first amplifier device and a common electrode of the second amplifier device are connected to a ground potential, and an output electrode of the first amplifier device and an output electrode of the second amplifier device are connected to the load device;
the first switch circuit, in response to a power mode signal at a first voltage level, supplies an RF input signal of the RF signal input terminal to an input electrode of the first amplifier device and to an input electrode of the second amplifier device so that the first amplifier device and the second amplifier device perform parallel amplification operations on the RF input signal;
the first switch circuit, in response to the power mode signal at a second voltage level different from the first voltage level, supplies the RF input signal of the RF signal input terminal to the input electrode of the first amplifier device and substantially stops supplying of the RF signal to the input electrode of the second amplifier device so that the first amplifier device performs a stand-alone amplification operation on the RF input signal;
one end of the impedance adjusting circuit is connected to a connection node between the output electrode of the first amplifier device and the output electrode of the second amplifier device, the other end of the impedance adjusting circuit is connected to one end of the second switch circuit, and the other end of the second switch circuit is connected to the ground potential;
the impedance adjusting circuit includes a reactance element connected between the one end and the other end of the impedance adjusting circuit; and
the second switch circuit causes the one end and the other end of the second switch circuit to be electrically disconnected from each other in response to the power mode signal at the second voltage level, and causes the one end and the other end of the second switch circuit to be electrically connected to each other in response to the power mode signal at the first voltage level.

2. The power amplifier according to claim 1, wherein the reactance element connected between the one end and the other end of the impedance adjusting circuit includes a capacitive reactance element.

3. The power amplifier according to claim 2, wherein the reactance element connected between the one end and the other end of the impedance adjusting circuit includes an inductive reactance element connected in series with the capacitive reactance element.

4. The power amplifier according to claim 3, further comprising:
an output matching circuit whose input terminal is connected to the output electrode of the first amplifier device and the output electrode of the second amplifier device; wherein
an antenna is connectable to an output terminal of the output matching circuit.

5. The power amplifier according to claim 4, wherein
the first switch circuit includes a first switch device connected between the input electrode of the first amplifier device and the input electrode of the second amplifier device; and
the first switch device of the first switch circuit is switched on in response to the power mode signal at the first voltage level while the first switch device of the first switch circuit is switched off in response to the power mode signal at the second voltage level.

6. The power amplifier according to claim 5, wherein the first switch circuit further includes a discharging element connected between the input electrode of the second amplifier device and the ground potential.

7. The power amplifier according to claim 5, wherein the second switch circuit includes a second switch device connected between the one end and the other end of the second switch circuit, and the second switch device is switched on in response to the power mode signal at the first voltage level while the second switch device is switched off in response to the power mode signal at the second voltage level.

8. The power amplifier according to claim 4, wherein the one end of the impedance adjusting circuit is connected to the input terminal of the output matching circuit.

9. The power amplifier according to claim 4, wherein the one end of the impedance adjusting circuit is connected to the output terminal of the output matching circuit.

10. The power amplifier according to claim 4, wherein
the output matching circuit includes an intermediate node between the input terminal and the output terminal of the output matching circuit; and
the one end of the impedance adjusting circuit is connected to a connection node between the input terminal and the intermediate node of the output matching circuit.

11. The power amplifier according to claim 4, wherein
the output matching circuit includes an intermediate node between the input terminal and the output terminal of the output matching circuit; and
the one end of the impedance matching circuit is connected to another connection node between the intermediate node and the output terminal of the output matching circuit.

12. The power amplifier according to claim 4, further comprising:
another amplifier device defining a bias device connected to the input electrode of the first amplifier device and the input electrode of the second amplifier device; wherein
a common electrode of the other amplifier device is connected to the ground potential and an input electrode and an output electrode of the other amplifier device are connected to the input electrode of the first amplifier device and the input electrode of the second amplifier device.

13. The power amplifier according to claim 12, wherein the first amplifier device, the second amplifier device, and the other amplifier device are MOS transistors or bipolar transistors.

14. An operation method for a power amplifier that includes an RF signal input terminal, a first amplifier device, a second amplifier device, a load device, a first switch circuit, a second switch circuit, and an impedance adjusting circuit, wherein a common electrode of the first amplifier device and a common electrode of the second amplifier device are connected to a ground potential, and an output electrode of the first amplifier device and an output electrode of the second amplifier device are connected to the load device, the operation method comprising:
supplying an RF input signal of the RF signal input terminal to an input electrode of the first amplifier device and to an input electrode of the second amplifier device in response to a power mode signal at a first voltage level, using the first switch circuit, and performing parallel amplification operations on the RF input signal, using the first amplifier device and the second amplifier device; and
supplying the RF input signal of the RF signal input terminal to the input electrode of the first amplifier device and substantially stopping supplying of the RF signal to the input electrode of the second amplifier device in response to the power mode signal at a second voltage level different from the first voltage level, using the first switch circuit, and performing a stand-alone amplification operation on the RF input signal, using the first amplifier device; wherein one end of the impedance adjusting circuit is connected to a connection node between the output electrode of the first amplifier device and the output electrode of the second amplifier device, the other end of the impedance adjusting circuit is connected to one end of the second switch circuit, and the other end of the second switch circuit is connected to the ground potential; and the impedance adjusting circuit includes a reactance element connected between the one end and the other end of the impedance adjusting circuit;

the operation method further comprising:

causing the one end and the other end of the second switch circuit to be electrically disconnected from each other in response to the power mode signal at the second voltage level and causing the one end and the other end of the second switch circuit to be electrically connected to each other in response to the power mode signal at the first voltage level, using the second switch circuit.

15. The operation method for the power amplifier power amplifier according to claim 14, wherein the reactance element connected between the one end and the other end of the impedance adjusting circuit includes a capacitive reactance element;

the reactance element connected between the one end and the other end of the impedance adjusting circuit includes an inductive reactance element connected in series with the capacitive reactance element;

the power amplifier further includes an output matching circuit whose input terminal is connected to the output electrode of the first amplifier device and the output electrode of the second amplifier device; and an antenna is connectable to an output terminal of the output matching circuit.

16. The operation method for the power amplifier power amplifier according to claim 15, wherein the first switch circuit includes a first switch device connected between the input electrode of the first amplifier device and the input electrode of the second amplifier device; and the first switch device of the first switch circuit is switched on in response to the power mode signal at the first voltage level while the first switch device of the first switch circuit is switched off in response to the power mode signal at the second voltage level.

17. The operation method for the power amplifier power amplifier according to claim 16, wherein the first switch device further includes a discharging element connected between the input electrode of the second amplifier device and the ground potential.

18. The operation method for the power amplifier power amplifier according to claim 16, wherein the second switch circuit includes a second switch device connected between the one end and the other end of the second switch circuit, and the second switch device is switched on in response to the power mode signal at the first voltage level while the second switch device is switched off in response to the power mode signal at the second voltage level.

19. The operation method for the power amplifier according to claim 15, wherein the one end of the impedance adjusting circuit is connected to the input terminal of the output matching circuit.

20. The operation method for the power amplifier according to claim 15, wherein the one end of the impedance adjusting circuit is connected to the output terminal of the output matching circuit.

* * * * *